US012563866B2

(12) United States Patent
Zhu et al.

(10) Patent No.: US 12,563,866 B2
(45) Date of Patent: Feb. 24, 2026

(54) LED AND METHOD OF MANUFACTURE

(71) Applicant: PORO TECHNOLOGIES LTD, Cambridge (GB)

(72) Inventors: Tongtong Zhu, Cambridge (GB); Yingjun Liu, Cambridge (GB); Muhammad Ali, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 350 days.

(21) Appl. No.: 18/040,542

(22) PCT Filed: Aug. 4, 2021

(86) PCT No.: PCT/GB2021/052020
§ 371 (c)(1),
(2) Date: Feb. 3, 2023

(87) PCT Pub. No.: WO2022/029434
PCT Pub. Date: Feb. 10, 2022

(65) Prior Publication Data
US 2023/0290903 A1 Sep. 14, 2023

(30) Foreign Application Priority Data

Aug. 4, 2020 (GB) ...................................... 2012098
Aug. 4, 2020 (GB) ...................................... 2012103
(Continued)

(51) Int. Cl.
*H10H 20/818* (2025.01)
*H10H 20/01* (2025.01)
(Continued)

(52) U.S. Cl.
CPC ...... *H10H 20/818* (2025.01); *H10H 20/0137* (2025.01); *H10H 20/825* (2025.01); *H10H 29/142* (2025.01)

(58) Field of Classification Search
CPC .... H10H 20/817; H10H 20/82; H10H 20/813; H10H 20/841; H10H 20/818; H10H 29/012; H10H 29/30
See application file for complete search history.

(56) References Cited

U.S. PATENT DOCUMENTS 10,361,341 B2 7/2019 Danesh et al.
2009/0001416 A1 1/2009 Chua
(Continued)

FOREIGN PATENT DOCUMENTS

CN 107946417 A 4/2018
CN 108520911 A 9/2018
(Continued)

OTHER PUBLICATIONS

Communication pursuant to Article 94(3) EPC for European Patent Application No. 21752134.3 (Nov. 21, 2024).
(Continued)

*Primary Examiner* — Alexander G Ghyka
(74) *Attorney, Agent, or Firm* — Merchant & Gould P.C.

(57) ABSTRACT

A light emitting diode (LED) comprises: an n-doped portion; a p-doped portion; and a light emitting region located between the n-doped portion and the p-doped portion. The light emitting region comprises: a light-emitting layer which emits light at a peak wavelength between 400 and 599 nm under electrical bias thereacross; a III-nitride layer located on the light-emitting layer; and a III-nitride barrier layer located on the III-nitride layer. The light emitting diode comprises a porous region of III-nitride material. An LED array and a method of manufacturing an LED with a peak emission wavelength between 400 nm and 599 nm under electrical bias are also provided.

22 Claims, 15 Drawing Sheets

(30) Foreign Application Priority Data

| | | |
|---|---|---|
| Aug. 4, 2020 | (GB) | 2012105 |
| Aug. 4, 2020 | (GB) | 2012108 |
| Aug. 4, 2020 | (GB) | 2012110 |
| Nov. 16, 2020 | (GB) | 2018016 |
| Jan. 22, 2021 | (WO) | PCT/GB2021/050147 |
| Jan. 22, 2021 | (WO) | PCT/GB2021/050152 |
| Jan. 22, 2021 | (WO) | PCT/GB2021/050158 |
| Jul. 28, 2021 | (GB) | 2110882 |

(51) Int. Cl.

| | |
|---|---|
| *H10H 20/825* | (2025.01) |
| *H10H 29/14* | (2025.01) |

(56) References Cited

U.S. PATENT DOCUMENTS

| | | |
|---|---|---|
| 2009/0140274 A1 | 6/2009 | Wierer |
| 2010/0140629 A1 | 6/2010 | Lee et al. |
| 2011/0193059 A1 | 8/2011 | Wierer |
| 2013/0011656 A1 | 1/2013 | Zhang |
| 2013/0146842 A1 | 6/2013 | Kim et al. |
| 2015/0041755 A1 | 2/2015 | Zhang |
| 2015/0047155 A1 | 2/2015 | Zhang |
| 2017/0237234 A1 | 8/2017 | Han et al. |
| 2018/0332677 A1 | 11/2018 | Ku et al. |
| 2018/0374988 A1 | 12/2018 | Mi |
| 2019/0123235 A1 | 4/2019 | Cho et al. |
| 2019/0214529 A1 | 7/2019 | Ahmed |
| 2020/0152841 A1 | 5/2020 | Han et al. |
| 2020/0227255 A1 | 7/2020 | Zhu et al. |

FOREIGN PATENT DOCUMENTS

| | | |
|---|---|---|
| CN | 110034216 A | 7/2019 |
| EP | 0584777 A1 | 3/1994 |
| JP | 2001060719 A | 3/2001 |
| JP | 2007-27298 A | 2/2007 |
| JP | 2007142426 A | 6/2007 |
| JP | 2007173316 A | 7/2007 |
| JP | 2007537600 A | 12/2007 |
| JP | 2009-21361 A | 1/2009 |
| JP | 2011501408 A | 1/2011 |
| JP | 2012038824 A | 2/2012 |
| JP | 2014045015 A | 3/2014 |
| JP | 2014-127708 A | 7/2014 |
| JP | 2014187159 A | 10/2014 |
| JP | 2018505567 A | 2/2018 |
| JP | 2018-533847 A | 11/2018 |
| JP | 2019036719 A | 3/2019 |
| KR | 1020190061088 A | 6/2019 |
| TW | 201208112 A | 2/2012 |
| WO | 2009/038324 A2 | 3/2009 |
| WO | 2013/140320 A1 | 9/2013 |
| WO | 2018/080860 A1 | 5/2018 |
| WO | 2019/027820 A1 | 2/2019 |
| WO | 2019/063957 | 4/2019 |
| WO | 2019/145728 | 8/2019 |

OTHER PUBLICATIONS

Inatomi et al., "Theoretical study of the composition pulling effect in InGaN metalorganic vapor-phase epitaxy growth," Japanese Journal of Applied Physics, vol. 56, No. 7 (2017).

International Search Report and Written Opinion for PCT/GB2021/050147 (Apr. 9, 2021).

International Search Report and Written Opinion for PCT/GB2021/050152 (Apr. 15, 2021).

International Search Report and Written Opinion for PCT/GB2021/050158 (Apr. 15, 2021).

International Search Report and Written Opinion for PCT/GB2021/052019 (Nov. 2, 2021).

Office Action for Japanese Patent Application No. 2022-544132 (Aug. 13, 2024).

International Search Report and Written Opinion of PCT/GB2021/052020, Nov. 2, 2021, 15 pages.

Pasayat, Shubhra S., et al., "Growth of strain—relaxed InGaN on micrometer—sized patterned compliant GaN pseudo—substrates", Applied Physics Letters, vol. 116, No. 11, Mar. 16, 2020, 6 pgs.

Alhassan, Abdullah I., et al., "High luminous efficacy green light—emitting diodes with AlGaN cap layer", Optics Express, vol. 24, No. 16, Jul. 27, 2016.

Pasayat, Shubhra S., et al., "Compliant micron-sized patterned InGaN Pseudo-Substrate Utilizing Porous GaN", Jan. 1, 2020, 10 pgs.

Dussaigne et al. (2020) "Full InGaN red light emitting diodes" Journal of Applied Physics. 128. 135704.

LED AND METHOD OF MANUFACTURE

The present invention relates to a light emitting diode (LED), and an improved method of manufacturing an LED.

BACKGROUND

III-V semiconductor materials are of particular interest for semiconductor device design, in particular the family of III-nitride semiconductor materials.

"III-V" semiconductors include binary, ternary and quaternary alloys of Group III elements, such as Ga, Al and In, with Group V elements, such as N, P, As and Sb), and are of great interest for a number of applications, including opto-electronics.

Of particular interest is the class of semiconductor materials known as "III-nitride" materials, which includes gallium nitride (GaN), indium nitride (InN) and aluminium nitride (AlN), along with their ternary and quaternary alloys. (Al,In)GaN is a term encompassing AlGaN, InGaN and GaN. III-nitride materials have not only achieved commercial success in solid-state lighting and power electronics, but also exhibit particular advantages for quantum light sources and light-matter interaction.

Doping of In into GaN semiconductor material is of interest for optoelectronic semiconductor devices, as varying the In content of the semiconductor alters the electronic bandgap of the material, and therefore the wavelength at which the semiconductor emits light. However, varying the In content of the material also affects the in-plane lattice constant of the semiconductor. For example, the in-plane lattice constant of InN is roughly 11% larger than that of GaN, with the lattice dimensions of intermediate compositions varying depending on the indium content. This creates a problem in device design where it is desirable to deposit an active semiconductor layer on top of a substrate layer that has different lattice dimensions. The reason for this is that the lattice mismatch at the layer boundary introduces strain into the lattice which leads to the formation of defects in the material which act as non-radiative recombination centres. This significantly harms device performance.

There is a huge demand for LEDs emitting at all visible wavelengths, particularly at longer wavelengths towards green, yellow and red, but manufacturers have historically encountered more problems manufacturing LEDs emitting at longer wavelengths.

One of the big challenges facing the growth of longer wavelength LEDs such as green, yellow and red LEDs on GaN-based platforms, for example, is the requirement to use high indium (In) contents to reduce the bandgap in the active region to an appropriate level for long-wavelength emission. The required InGaN active regions have a larger lattice parameter than the underlying GaN and the resulting strain leads to the formation of defects in the material which act as non-radiative recombination centres deteriorating device performance.

High quality InGaN (with high Indium content>20%) is therefore difficult to achieve, due to the large lattice mismatch between InN and GaN. The misfit strain also results in a reduced indium composition through the composition pulling effect.

Shorter-wavelength LEDs are easier to manufacture, as they can be made using InGaN light emitting regions containing a lower proportion of Indium than is needed for longer-wavelength light emission.

SUMMARY OF INVENTION

The present application relates to an improved method of manufacturing LEDs, and to LEDs made using that method.

The invention is defined in the independent claims, to which reference should now be made. Preferred or advantageous features of the invention are defined in the appended sub-claims.

The light-emitting diodes, or LEDs, described in the present application are preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including opto-electronics.

Of particular interest is the class of semiconductor materials known as "III-nitride" materials, which includes gallium nitride (GaN), indium nitride (InN) and aluminium nitride (AlN), along with their ternary and quaternary alloys (Al,In)GaN. Different crystal orientations may be used in the present invention, such as polar c-plane, non-polar and semi-polar orientations.

There are two primary non-polar orientations, a-plane (11-20) and m-plane (1-100). For semi-polar, there are (11-22), {2021} which is a family of crystal planes. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk III-nitrides, such as GaN can profoundly affect its material properties (optical, mechanical, electrical, and thermal, etc.). The possibility of tuning a wide range of material properties of GaN and III-nitrides semiconductors by altering its porosity therefore makes porous GaN of great interest for opto-electronic applications.

The present invention will be described by reference to GaN and InGaN, but may advantageously be applicable to alternative III-nitride material combinations.

In the following description, a substrate for overgrowth is a semiconductor structure, on which a further semiconductor layer is to be grown in order to result in a semiconductor device. An exemplary substrate for overgrowth in the present invention may be a GaN semiconductor structure, comprising multiple layers of doped and undoped GaN.

Layers of the semiconductor structure may be porosified by electrochemical etching as set out in international patent applications PCT/GB2017/052895 (published as WO2019/063957) and PCT/GB2019/050213 (published as WO2019/145728).

The inventors have found that LEDs can advantageously be provided using the present invention.

LED

According to a first aspect of the invention there is provided a light emitting diode (LED), comprising:

an n-doped portion;

a p-doped portion; and a light emitting region located between the n-doped portion and a p-doped portion, the light emitting region comprising:

a light-emitting layer which emits light at a peak wavelength between 400 and 599 nm under electrical bias thereacross;

a III-nitride layer located on the light-emitting layer; and a III-nitride barrier layer located on the III-nitride layer,

wherein the light emitting diode comprises a porous region of III-nitride material.

The present inventors have realised that electrochemical porosification of III-nitride materials advantageously leads to a reduction in the strain in the III-nitride lattice, and the overall wafer bow or curvature. Without wishing to be bound by theory, it is thought that the process of porosifying the porous region of III-nitride material also etches away structural defects, such as threading dislocations which were formed during growth of that layer on top of the layer of first III-nitride material.

The removal of dislocations from the semiconductor material of the porous region during porosification greatly reduces the strain in the porous region, which occurs particularly if the lattice dimension of the porous region does not match the lattice dimension of the underlying material. Thus, during epitaxial growth of the semiconductor structure when layers of III-nitride material are deposited above the porous region, the porous material is more compliant to matching the lattice of the overlying non-porous layers. This results in the layers above the porous region experiencing significantly lower strain than would be the case without the porous region.

As the second III-nitride material experiences lower strain, there are also fewer structural defects in the non-porous layer to act as non-radiative recombination centres to harm device performance.

Composition pulling effect: Kawaguchi et al. reported a so-called InGaN composition pulling effect in which the indium fraction is smaller during the initial stages of growth but increases with increasing growth thickness. This observation was to a first extent independent of the underlying layer, GaN or AlGaN. The authors suggested that this effect is caused by strain caused by the lattice mismatch at the interface. They found that a larger lattice mismatch between InGaN and the bottom epitaxial layers was accompanied by a larger change in the In content.

In *Theoretical study of the composition pulling effect in InGaN metalorganic vapor-phase epitaxy growth* by Inatomi et al (Japanese Journal of Applied Physics, Volume 56, Number 7) it was found that compressive strain suppresses the incorporation of InN. On the other hand, tensile strain promotes the incorporation of InN compared to the relaxed bulk growth case.

The inventors have found that the use of a porous region in the semiconductor structure leads to "strain relaxation" which reduces strain in the layers of a semiconductor structure, and that this can lead to an improvement with respect to the composition pulling effect. Porosification reduces the strain in the III-nitride layers and the semiconductor structure is made less strained, and thus the conditions for higher incorporation of In are made available. The present invention can therefore aid in higher Indium incorporation into layers of the LED grown on top of the porous region, which is highly desirable for emission at longer wavelengths.

The n-doped region, the light emitting region, and the p-doped region are preferably provided above the porous region. In other words, the porous region may be positioned under the n-doped region, the light emitting region, and the p-doped region in the LED structure.

The light-emitting layer may preferably be an indium gallium nitride (InGaN) layer.

By providing a porous region of III-nitride material in the LED, the n-doped region, the light emitting region, and the p-doped region may therefore be grown over the porous region with a lower strain than would be possible without the porous region. This reduced level of strain in the layered semiconductor structure can therefore aid in higher Indium incorporation into the light emitting layer(s) of the LED, so that high quality InGaN light emitting layers can be grown with a high Indium content. This allows enough indium to be incorporated into the light-emitting indium gallium nitride layer so that the LED emits light at a peak wavelength between 400 and 599 nm when an electrical bias is applied across the LED.

As mentioned in the background section above, although there is a huge demand for LEDs that emit light between 400 and 599 nm, the technical difficulties of incorporating enough indium into the light emitting layer(s) has meant longer wavelength LEDs have been hard to achieve.

The light-emitting layer may emit light at a peak wavelength between 400 and 599 nm under electrical bias thereacross, or between 400 and 590 nm under electrical bias thereacross, or between 430 and 570 nm under electrical bias thereacross.

The inventors have found that growing an LED structure over a porous region of III-nitride material causes a significant shift in emission wavelength towards longer wavelengths, compared to an identical LED structure grown on a non-porous substrate.

The inventors have demonstrated this by growing a conventional green (emission between 500-520 nm) InGaN LED structure on a non-porous GaN wafer, and demonstrating that the LED emits green light as expected. The same "green" InGaN LED structure was then grown on a template containing a porous region, and when an electrical bias was applied across the LED the LED emitted light a longer (red-shifted) wavelength range of between 530 and 550 nm.

A similar red-shift has been demonstrated by growing a conventional blue LED on GaN, which emitted light around a peak wavelength of 435 nm as expected, and then growing the same LED structure over a template containing a porous region, after which the LED emitted at a peak emission wavelength of 450-460 nm.

The present invention therefore allows conventional, easily-manufacturable LED structures to be shifted to longer wavelength emission, so structures previously used as shorter-wavelength (violet or blue for example) LEDs can be made into longer-wavelength LEDs by incorporating a porous region into the structure. This may advantageously allow LEDs to be made without many of the technical problems experienced in prior art designs.

Conventionally, in order to grow InGaN quantum wells incorporating higher quantities of indium which are required for longer-wavelength emission, lower growth temperatures have been required during epitaxial deposition of InGaN material. Downsides of lower growth temperatures include the presence of more defects in the crystal structure, and lower NH3 cracking efficiencies.

In the present invention, however, the presence of the porous region in the LED template during growth reduces the strain in the crystal structure, and enables a higher incorporation of In into the active region than has previously been possible at a given growth temperature. By incorporating a porous region into the structure, there is therefore no longer the same need to lower the growth temperature of the InGaN to increase In incorporation, as larger quantities of In are incorporated at higher temperatures. This allows higher InGaN growth temperatures to be used for the LED, leading to higher crystal quality, fewer defects, and improved performance and LED characteristics than similar-wavelength LEDs in the prior art.

The LED light emitting region is preferably an LED light emitting region for emitting at a peak wavelength lower than the peak emission wavelength of the LED, and the porous region of III-nitride material shifts the peak emission wavelength of the light-emitting region to a longer peak emission wavelength.

The magnitude of the red-shift caused by the porous region under the LED structure depends on a number of factors, including the porosity and thickness of the porous region, and the design of the LED active region. A large variety of LED active regions are known to those skilled in the art, and variations in epitaxial design (thickness, composition, doping levels) are conventional in the state of the art.

While the magnitude of the red shift may differ between different LED structures, in preferred embodiments the porous region creates a typical wavelength red-shift of between 15 nm and 80 nm, or preferably 15 nm and 50 nm, particularly preferably 30 nm to 50 nm or 30 nm to 40 nm. Thus a conventional LED structure grown on a non-porous GaN substrate will emit at a peak emission wavelength under electrical bias that is 15 to 80 nm, or 15 to 50 nm, or 30 nm to 50 nm shorter than the same LED structure grown over a template containing a porous region.

For example the LED light emitting region may be an LED light emitting region for emitting at a peak wavelength 15 to 80 nm below the desired peak emission wavelength of the LED, and the porous region of III-nitride material may red-shift the emission spectrum of the light-emitting region by 15 to 80 nm to arrive at the peak emission wavelength of the LED according to the present invention.

Alternatively the LED light emitting region may be an LED light emitting region for emitting at a peak wavelength 15 nm to 50 nm below the desired peak emission wavelength of the LED, and the porous region of III-nitride material may red-shift the emission spectrum of the light-emitting region by 15 nm to 50 nm to arrive at the peak emission wavelength of the LED according to the present invention.

Alternatively the LED light emitting region may be an LED light emitting region for emitting at a peak wavelength 30 nm to 50 nm or preferably 30 nm to 40 nm below the desired peak emission wavelength of the LED, and the porous region of III-nitride material may red-shift the emission spectrum of the light-emitting region by 30 nm to 50 nm or 30 nm to 40 nm to arrive at the peak emission wavelength of the LED according to the present invention.

The LED light emitting region may be an LED light emitting region that is suitable for emitting, or configured to emit, light at a variety of different peak wavelengths, when grown on a non-porous GaN template. For example the LED light emitting region may be a light emitting region known in the art, and configured to emit blue light (at 475 nm, for example) when grown on a conventional non-porous semiconductor template. By growing that "blue" LED light emitting region on a porous template to form an LED according to the present invention, however, the LED structure will experience a red-shift such that the LED emits light at a longer wavelength than the normal 475 nm emission wavelength.

For example, the LED light emitting region is an LED light emitting region for emitting at a peak wavelength of 520-555 nm, or 445-520 nm, or 400-445 nm, or 385-425 nm when not overgrown on a porous III-nitride layer. Growth of the LED light emitting region over the porous region of III-nitride material may however shift the emission wavelength of the light-emitting region to a peak emission wavelength longer than the expected peak wavelength for that light-emitting region.

In some previous attempts to introduce porous material into LEDs, the porous material was found to lead to a high degree of spectral broadening, so that the full width half max (FWHM) of the spectral emission peak became undesirably broad. This is undesirable for most LED applications, where a narrow emission peak is preferred so that the light emitted by the LED is at or close to the desired wavelength.

Advantageously, in the present invention the LED preferably emits light with a FWHM of 50 nm or less, or 40 nm or less or 30 nm or less, preferably in which the LED has a FWHM of <40 nm, and more preferably <20 nm.

In preferred embodiments, the light emitting layer is a light-emitting indium gallium nitride layer. The LED preferably also comprises a region of GaN material. Due to the lattice mismatch between GaN and InGaN, the stress relaxation effect created by the porous region is particularly advantageous.

The light emitting diode may comprise at least one feature selected from:

(a) the light emitting region comprises one or two or three or four or five or six or seven or eight quantum wells (or at least one quantum well); or (b) the III-nitride layer comprises an aluminium gallium nitride layer which has a composition $Al_yGa_{(1-y)}N$, where y is in a range from 0.1 to 1.0; or (c) a UV or blue emitting InGaN/GaN or InGaN/inGaN superlattice or InGaN layer is located between the n-doped portion and the light emitting region.

Orange LED

In a preferred aspect of the invention, the LED is an orange LED, and the light emitting region emits light at a peak wavelength between 590 and 599 nm, or between 592 and 597 nm under electrical bias.

In order to provide an orange LED when the LED structure is overgrown over the porous region, the LED light emitting region may be an LED light emitting region for emitting at a peak wavelength of 540-560 nm or 540-580 nm, and the porous region of III-nitride material may shift the emission wavelength of the light-emitting region to a yellow wavelength, for example between 590 and 599 nm.

Yellow LED

In a preferred aspect of the invention, the LED is a yellow LED, and the light emitting region emits light at a peak wavelength between 570 and 589 nm under electrical bias, or between 580 and 595 nm under electrical bias.

In order to provide a yellow LED when the LED structure is overgrown over the porous region, the LED light emitting region may be an LED light emitting region for emitting at a peak wavelength of 520-540 nm or 540-560 nm, and the porous region of III-nitride material may shift the emission wavelength of the light-emitting region to a yellow wavelength, for example between 570 and 589 nm or 575-585 nm.

In one preferred embodiment of a yellow LED, the light-emitting layer may have the composition $In_xGa_{1-x}N$, in which $0.25 \leq x \leq 0.35$.

Green LED

In another preferred aspect of the present invention, the LED is a green LED, and the light emitting region preferably emits light at a peak wavelength between 500 and 569 nm, or between 510 and 555 nm under electrical bias, or between 520 and 540 nm under electrical bias.

In order to provide a green LED when the LED structure is overgrown over the porous region, the LED light emitting region may be an LED light emitting region for emitting at a peak wavelength of 450-520 nm, and the porous region of III-nitride material may shift the emission wavelength of the light-emitting region to a green wavelength, for example between 500 and 569 nm or between 520 and 540 nm. Alternatively the LED light emitting region may be an LED light emitting region for emitting at a peak wavelength of 470-540 nm, and the porous region of III-nitride material may shift the emission wavelength of the light-emitting region to a longer green wavelength.

In one preferred embodiment of a green LED, the light-emitting layer may have the composition $In_xGa_{1-x}N$, in which $0.22 \leq x \leq 0.30$, preferably x=0.25.

Blue LED

In another preferred aspect of the invention, the LED is a blue LED, and the light emitting region emits light at a peak wavelength between 450 and 499 nm under electrical bias, or between 450 and 485 nm under electrical bias, or between 460 and 475 nm under electrical bias.

In order to provide a blue LED when the LED structure is overgrown over the porous region, the LED light emitting region may be an LED light emitting region for emitting at a peak wavelength of 400-450 nm or 420-430 nm, and the porous region of III-nitride material may shift the emission wavelength of the light-emitting region to a blue wavelength, for example between 450 and 499 nm. Alternatively the LED light emitting region may be an LED light emitting region for emitting at a peak wavelength of 420-470 nm, and the porous region of III-nitride material may shift the emission wavelength of the light-emitting region to a longer blue wavelength between 450 and 499 nm.

In one preferred embodiment of a blue LED, the light-emitting layer may have the composition $In_xGa_{1-x}N$, in which $0.12 \leq x \leq 0.25$, or $0.15 \leq x \leq 0.22$ Violet LED In another preferred aspect of the invention, the LED is a violet LED, and the light emitting region emits light at a peak wavelength between 400 and 449 nm under electrical bias, or between 410 and 430 nm under electrical bias.

In order to provide a violet LED when the LED structure is overgrown over the porous region, the LED light emitting region may preferably be an LED light emitting region for emitting at a peak wavelength of 385-425 nm, and the porous region of III-nitride material may shift the emission wavelength of the light-emitting region to between 400 and 449 nm.

In one preferred embodiment of a violet LED, the light-emitting layer may have the composition $In_xGa_{1-x}N$, in which $0.05 \leq x \leq 0.17$, or $0.07 \leq x \leq 0.12$.

Template

The n-type region, the light emitting region and the p-type region (which may be called the LED structure) are preferably grown over a semiconductor template which contains the porous region. The semiconductor template may also contain a number of layers of semiconductor material arranged to provide a suitable substrate for the overgrowth of the LED structure. Once the n-type region, the light emitting region and the p-type region have been grown on the template, however, the LED structure and the template both form part of the LED.

The porous region may have a thickness of at least 1 nm, preferably at least 10 nm, particularly preferably at least 50 nm. For example, the porous region may have a thickness between 1 nm and 10000 nm.

The porous region may have a porosity between 1% and 99% porosity, or between 10% and 80% porosity, or between 20% and 70% porosity, or between 30% and 60% porosity.

The porosity of the porous region may be measured as the volume of all pores relative to the volume of the whole porous region.

The degree of porosity has been found to have an effect on the magnitude of the wavelength shift caused by the porous region. In general, the higher the % porosity, the larger the wavelength shift of the LED compared to the same LED structure on a non-porous template.

The porous region is preferably formed from one of GaN, InGaN, AlGaN, AlInGaN or AlN.

The porous region may be under or below the n-type region, the light emitting region and the p-type region of the LED. Preferably the n-type region, the light emitting region and the p-type region (the LED structure) is positioned on or over the porous region, as defined by the order of growth of the layers in the LED. The LED structure is preferably overgrown over the porous region, so that the LED structure benefits from the strain relaxation in the porous III-nitride layer.

The LED may comprise a connecting layer of III-nitride material positioned between the n-doped portion and the porous region. Preferably the thickness of the connecting layer is at least 100 nm, though lesser or greater thicknesses could also be employed. The connecting layer may preferably be one of GaN, InGaN, AlGaN, AlInGaN or AlN.

The LED preferably comprises a non-porous intermediate layer of III-nitride material porous region between the porous region and the light emitting region. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer advantageously provides a smooth surface for overgrowth of further layers during manufacture.

Preferably the LED comprises a non-porous intermediate layer of III-nitride material positioned between the porous region and the connecting layer. This may preferably be a non-porous layer through which electrochemical etching of the porous region takes place.

The non-porous intermediate layer may preferably be one of GaN, InGaN, AlGaN, AlInGaN or AlN.

The porous region may be a porous layer, such that the light emitting diode comprises a porous layer of III-nitride material. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The light emitting region may be formed over a porous region comprising a stack of porous layers of III-nitride material.

In some embodiments, the light emitting region is positioned over a stack of multiple porous layers of III-nitride material. Thus, rather than being a single porous layer of III-nitride material, the porous region may be a stack of layers of III-nitride material in which at least some layers are porous. The stack of porous layers may preferably be a stack of alternating porous and non-porous layers.

Alternatively the porous region may be a layer of III-nitride material that contains one or more porous regions, for example one or more porous regions in an otherwise non-porous layer of III-nitride material. In other words, the porous region need not be a continuous layer of porous material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm$^2$, or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around $\frac{1}{10}$ of a pixel (for example 0.1 μm), up to the lateral dimensions of the substrate itself.

The n-doped portion preferably comprises an n-doped III-nitride layer.

Preferably the n-doped portion and/or the n-doped layer comprises n-GaN, or n-InGaN, or a stack of alternating layers of n-GaN/n-InGaN, or a stack of alternating layers of n-InGaN/n-InGaN containing different concentrations of indium.

The n-doped portion may comprise a single-crystalline n-doped III-nitride portion, preferably in which the n-doped portion comprises a single-crystalline n-doped III-nitride layer having a planar top surface.

The porous region and each layer between the porous region and the single-crystalline n-doped III-nitride layer may be planar layers having a respective top surface and a respective bottom surface that are parallel to the planar top surface of the single-crystalline n-doped III-nitride layer.

The light-emitting layer preferably comprises one or more InGaN quantum wells, preferably between 1 and 7 quantum wells.

The light emitting layer may be a nanostructured layer of InGaN comprising quantum structures such as quantum dots, fragmented quantum well, or discontinuous quantum well.

The light-emitting layer and/or the quantum wells preferably have the composition $In_xGa_{1-x}N$, in which $0.07 \leq x \leq 0.35$, preferably $0.12 \leq x \leq 0.30$ or $0.22 \leq x \leq 0.30$, particularly preferably $0.22 \leq x \leq 0.27$.

The LED preferably comprises a III-nitride layer located on the light-emitting layer; and a III-nitride barrier layer located on the III-nitride layer.

The III-nitride layer on the light-emitting layer may be termed a "cap layer". This cap layer is used to 1) increase the quantum confined stark effect for band bending, hence the red shift and achieving longer-wavelength emission, and 2) to protect the high In % in InGaN to ensure sufficient In % is incorporated for achieving long wavelengths, as well as providing a larger barrier.

The LED preferably comprises a cap layer of III-nitride material between the quantum wells and the p-doped region. The cap layer could be GaN, InGaN, AlGaN, or AlN.

The LED preferably comprises a barrier layer of III-nitride material between the quantum wells and the p-doped region. The barrier layer could be GaN, InGaN, AlGaN, or AlN.

The p-doped region may comprise a p-doped III-nitride layer and a p-doped aluminium gallium nitride layer positioned between the p-doped III-nitride layer and the light emitting region. The p-doped aluminium nitride layer is preferably an electron-blocking-layer (EBL) positioned between the cap layer and the p-type layer, in which the electron-blocking-layer contains 5-25 at % aluminium, preferably in which the electron-blocking-layer has a thickness of between 10-50 nm.

The porous region is preferably not part of a distributed Bragg reflector (DBR).

Pixel Sizes

The light-emitting region, and/or the LED, may have lateral dimensions (width and length) of greater than 100 μm and less than 300 μm. In this case, the LED may be termed a "mini-LED". In preferred embodiments, the mini-LED may be square or circular or square with circular corners and have dimensions such as 300 μm×300 μm, 200 μm×200 μm, 100 μm×100 μm.

The light-emitting region, and/or the LED, may alternatively have lateral dimensions (width and length) of less than 100 μm. In this case, the LED may be termed a "micro-LED". The micro-LED may preferably have lateral dimensions of less than 80 μm, or 70 μm, or 60 μm, or 50 μm or 30 μm, or 25 μm, or 20 μm, or 15 μm or 10 μm, or 5 μm or 3 μm or 1 μm or 500 nm, or 200 nm, or 100 nm, or 50 nm.

In preferred embodiments, the micro-LED may be square or circular or square with circular corners and have dimensions such as 75 μm×75 μm, 50 μm×50 μm, 40 μm×40 μm, 30 μm×30 μm, 25 μm×25 μm, 20 μm×20 μm or 10 μm×10 μm, or 5 μm×5 μm, or 2 μm×2 μm, or 1 μm×1 μm, or 500 nm×500 nm or smaller.

The LEDs may optionally be circular, square, rectangular, hexagonal, or triangular in shape. In the case of irregular-shapes of pixel design, at least one dimension should fall within the dimensions defined above in order for the LEDs to be classed as mini- or micro-LEDs. For example the width or diameter of the LEDs are preferably less than 100 μm so that the LEDs are classed as micro-LEDs.

Mini-LED

In a second aspect of the present invention there may be provided a mini-LED, comprising the LED according the first aspect of the invention, in which the light-emitting region has lateral dimensions (width and length) of greater than 100 μm and less than 300 μm or 200 μm. In preferred embodiments, the mini-LED may be square or circular or square with circular corners and have dimensions such as 300 μm×300 μm, 200 μm×200 μm, 100 μm×100 μm.

Micro-LED

In a third aspect of the present invention there may be provided a micro-LED, comprising the LED according to the first aspect of the invention, in which the light-emitting region has lateral dimensions of less than 100 μm. The micro-LED may preferably have lateral dimensions of less than 80 μm, or 70 μm, or 60 μm, or 50 μm or 30 μm, or 25 μm, or 20 μm, or 15 μm or 10 μm, or 5 μm or 3 μm or 1 μm or 500 nm, or 200 nm, or 100 nm, or 50 nm.

Micro-LED Array

In a fourth aspect of the present invention there may be provided a microLED array, comprising a plurality of micro-LEDs according to the third aspect of the invention.

Green LED

According to a fifth aspect of the invention there is provided a green light emitting diode (LED), comprising:
    an n-doped portion;
    a p-doped portion; and
    a light emitting region located between the n-doped portion and a p-doped portion, the light emitting region comprising:
    a light-emitting layer which emits light at a peak wavelength between 500 and 570 nm under electrical bias thereacross;

a III-nitride layer located on the light-emitting layer; and
a III-nitride barrier layer located on the III-nitride layer,
wherein the light emitting diode comprises a porous
region of III-nitride material.

The light emitting region of the green LED may prefer-
ably emit light at a peak wavelength between 500 and 570
nm under electrical bias, or between 510 and 555 nm under
electrical bias, or between 520 and 540 nm under electrical
bias.

In order to provide a green LED when the LED structure
is overgrown over the porous region, the LED light emitting
region may be an LED light emitting region for emitting at
a peak wavelength of 450-520 nm, or between 470 nm and
510 nm, and the porous region of III-nitride material may
shift the emission wavelength of the light-emitting region to
a green wavelength, for example between 500 and 570 nm
or between 520 and 540 nm.

In one preferred embodiment of a green LED, the light-
emitting layer may have the composition $In_xGa_{1-x}N$, in
which $0.22 \leq x \leq 0.30$, preferably $x=0.25$.

The features described above in relation to the first to
fourth aspects are equally applicable to the green LED.

Blue LED

According to a sixth aspect of the invention there is
provided a blue light emitting diode (LED), comprising:

an n-doped portion;
a p-doped portion; and
a light emitting region located between the n-doped
portion and a p-doped portion, the light emitting region
comprising:
a light-emitting layer which emits light at a peak wave-
length between 450 and 500 nm under electrical bias
thereacross;
a III-nitride layer located on the light-emitting layer; and
a III-nitride barrier layer located on the III-nitride layer,
wherein the light emitting diode comprises a porous
region of III-nitride material.

The light emitting region may emit light at a peak
wavelength between 450 and 500 nm under electrical bias,
or between 455 and 485 nm under electrical bias, or between
460 and 475 nm under electrical bias.

In order to provide a blue LED when the LED structure
is overgrown over the porous region, the LED light emitting
region may be an LED light emitting region for emitting at
a peak wavelength of 400-445 nm or 420-430 nm, and the
porous region of III-nitride material may shift the emission
wavelength of the light-emitting region to a blue wave-
length, for example between 450 and 500 nm.

In one preferred embodiment of a blue LED, the light-
emitting layer may have the composition $In_xGa_{1-x}N$, in
which $0.12 \leq x \leq 0.22$, or $0.15 \leq x \leq 0.20$.

The features described above in relation to the first to
fourth aspects are equally applicable to the blue LED.

Method of Manufacture

In a seventh aspect of the present invention there may be
provided a method of manufacturing a LED, comprising the
step of overgrowing, over a porous region of III-nitride
material:

an n-doped portion;
a p-doped portion; and
a light emitting region located between the n-doped
portion and a p-doped portion, the light emitting region
comprising a light-emitting layer which emits light at a
peak wavelength between 400 and 599 nm under
electrical bias thereacross.

Alternatively, the method may comprise the step of grow-
ing an LED structure over a porous region of III-nitride material, at a higher growth temperature than has previously
been possible. As the presence of the porous region of
III-nitride material means that the semiconductor lattice is
strain-relaxed, a higher-than-usual growth temperature can
be used to incorporate the required indium when growing
the InGaN light emitting layer. The LED structure over-
grown on the porous region may be a known LED structure,
but in this case the use of the porous template advanta-
geously allows the LED light emitting layers, for example
InGaN quantum wells (QWs) to be grown at a higher growth
temperature than is possible when overgrowing on non-
porous substrates.

In an eighth aspect of the present invention there may be
provided a method of manufacturing a LED, comprising the
step of overgrowing, over a porous region of III-nitride
material:

an n-doped portion;
a p-doped portion; and
an LED light emitting region between the n-doped portion
and a p-doped portion, the light emitting region com-
prising a light-emitting layer for emitting at a peak
wavelength of 385-555 nm,
wherein overgrowth on the porous region of III-nitride
material shifts the emission wavelength of the light-
emitting region to a peak wavelength between 400 and
599 nm under electrical bias.

In a ninth aspect of the present invention there may be
provided a method of manufacturing an LED with a peak
emission wavelength between 400 nm and 599 nm under
electrical bias, comprising the step of overgrowing, over a
porous region of III-nitride material, an LED structure
comprising:

an n-doped portion;
a p-doped portion; and
a light emitting region for emitting at a wavelength lower
than the peak emission wavelength of the LED, in
which the porous region of III-nitride material red-
shifts the emission wavelength of the light-emitting
region to the peak emission wavelength.

The LED structure, including the n-doped portion, the
p-doped portion, and the light emitting region, may be an
LED structure for emitting at a wavelength lower than the
peak emission wavelength of the LED, so that the porous
region of III-nitride material red-shifts the emission wave-
length of the light-emitting region to the peak emission
wavelength.

The following discussion applies to the methods of the
seventh, eighth and ninth aspects of the invention.

The LED light emitting region may be an LED light
emitting region for emitting at a peak wavelength 15 to 80
nm below the desired peak emission wavelength of the LED,
and the porous region of III-nitride material may red-shift
the emission spectrum of the light-emitting region by 15 to
80 nm.

Alternatively the LED light emitting region may be an
LED light emitting region for emitting at a peak wavelength
15 nm to 50 nm below the desired peak emission wavelength
of the LED, and the porous region of III-nitride material may
red-shift the emission spectrum of the light-emitting region
by 15 nm to 50 nm.

The LED light emitting region may be an LED light
emitting region that is suitable for emitting, or configured to
emit, light at a variety of different peak wavelengths, when
grown on a non-porous GaN template. For example the LED
light emitting region may be a light emitting region known
in the art, and configured to emit blue light (at 475 nm, for
example) when grown on a conventional non-porous semiconductor template. By growing that "blue" LED light emitting region on a porous template to form an LED according to the present invention, however, the LED structure will experience a red-shift such that the LED emits light at a longer wavelength than the normal 475 nm emission wavelength.

For example, the LED light emitting region is an LED light emitting region for emitting at a peak wavelength of 520-555 nm, or 445-520 nm, or 400-445 nm, or 385-425 nm when not overgrown on a porous III-nitride layer. Growth of the LED light emitting region over the porous region of III-nitride material may however shift the emission wavelength of the light-emitting region to a peak emission wavelength longer than the expected peak wavelength for that light-emitting region.

In preferred embodiments, the light emitting layer is a light-emitting indium gallium nitride layer. The LED preferably also comprises a region of GaN material. Due to the lattice mismatch between GaN and InGaN, the stress relaxation effect created by the porous region is particularly advantageous.

Orange LED Manufacture

The method may be a method of manufacturing an orange LED with a peak emission wavelength between 590 nm and 599 nm under electrical bias.

In order to provide a yellow LED when the LED structure is overgrown over the porous region, the LED light emitting region may be an LED light emitting region for emitting at a peak wavelength of 540-560 nm, and the porous region of III-nitride material may shift the emission wavelength of the light-emitting region to an orange wavelength, for example between 590 and 599 nm.

In one preferred embodiment of an orange LED, the light-emitting layer may have the composition $In_xGa_{1-x}N$, in which $0.25 \leq x \leq 0.35$.

Yellow LED Manufacture

The method may be a method of manufacturing a yellow LED with a peak emission wavelength between 570 nm and 589 nm under electrical bias, or between 575 and 585 nm under electrical bias.

In order to provide a yellow LED when the LED structure is overgrown over the porous region, the LED light emitting region may be an LED light emitting region for emitting at a peak wavelength of 520-540 nm or 540-560 nm, and the porous region of III-nitride material may shift the emission wavelength of the light-emitting region to a yellow wavelength, for example between 570 and 589 nm or 575-585 nm.

In one preferred embodiment of a yellow LED, the light-emitting layer may have the composition $In_xGa_{1-x}N$, in which $0.25 \leq x \leq 0.35$.

Green LED Manufacture

The method may be a method of manufacturing a green LED with a peak emission wavelength between 500 nm and 570 nm under electrical bias, or between 510 and 555 nm under electrical bias, or between 520 and 540 nm under electrical bias.

In order to provide a green LED when the LED structure is overgrown over the porous region, the LED light emitting region may be an LED light emitting region for emitting at a peak wavelength of 450-520 nm, or between 470 and 540 nm, and the porous region of III-nitride material may shift the emission wavelength of the light-emitting region to a green wavelength or a longer green wavelength, for example between 495 and 570 nm or between 520 and 540 nm.

In one preferred embodiment of a green LED, the light-emitting layer may have the composition $In_xGa_{1-x}N$, in which $0.22 \leq x \leq 0.30$, preferably x=0.25.

Blue LED Manufacture

The method may be a method of manufacturing a blue LED with a peak emission wavelength between 450 nm and 499 nm under electrical bias, or between 450 and 485 nm under electrical bias, or between 460 and 475 nm under electrical bias.

In order to provide a blue LED when the LED structure is overgrown over the porous region, the LED light emitting region may be an LED light emitting region for emitting at a peak wavelength of 400-450 nm, or 420-470 nm, and the porous region of III-nitride material may shift the emission wavelength of the light-emitting region to a blue wavelength or a longer blue wavelength, for example between 450 and 499 nm.

In one preferred embodiment of a blue LED, the light-emitting layer may have the composition $In_xGa_{1-x}N$, in which $0.12 \leq x \leq 0.22$, or $0.15 \leq x \leq 0.20$.

Violet LED Manufacture

The method may be a method of manufacturing a blue LED with a peak emission wavelength between 400 and 449 nm under electrical bias, or between 410 and 430 nm under electrical bias.

In order to provide a violet LED when the LED structure is overgrown over the porous region, the LED light emitting region may preferably be an LED light emitting region for emitting at a peak wavelength of 385-425 nm, and the porous region of III-nitride material may shift the emission wavelength of the light-emitting region to between 400 and 449 nm.

In one preferred embodiment of a violet LED, the light-emitting layer may have the composition $In_xGa_{1-x}N$, in which $0.05 \leq x \leq 0.17$, or $0.07 \leq x \leq 0.12$.

Manufacturing Steps

The n-type region, the light emitting region and the p-type region (which may be called the LED structure) are preferably grown over a semiconductor template which contains the porous region. The semiconductor template may also contain a number of layers of semiconductor material arranged to provide a suitable substrate for the overgrowth of the LED structure.

The method may comprise the first step of electrochemically porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728).

The method may preferably comprise the step of forming the porous region of III-nitride material by electrochemical porosification through a non-porous layer of III-nitride material, such that the non-porous layer of III-nitride material forms a non-porous intermediate layer. The non-porous intermediate layer may advantageously provide a smooth surface for overgrowth of further layers, such as one or more connecting layers of III-nitride material.

The porous region may be formed by porosifying one or more layers or regions of III-nitride material on a substrate. The substrate may be Silicon, Sapphire, SiC, $\beta$-Ga2O3. The crystal orientation of the substrates can be polar, semi-polar or non-polar orientation. The substrate thickness may typically vary between 100 μm and 1500 μm.

The porous region may be a porous layer, such that the method comprises the step of overgrowing, over a porous layer of III-nitride material: an n-doped portion; a p-doped portion; and an LED light emitting region. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region.

Alternatively the porous region may be a layer of III-nitride material that contains one or more porous regions, for example one or more porous regions in an otherwise non-porous layer of III-nitride material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm², or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around $1/10$ of a pixel (for example 0.1 μm), up to the lateral dimensions of the substrate itself.

Prior to the porosification step, a doped region of n-doped III-nitride semiconductor material, preferably containing a layer, or stack of layers, may be deposited on a substrate. The III-nitride layer(s) may contain one or a combination of these elements: Al, Ga, In (ternary of quaternary layer). The thickness of the III-nitride stack is preferably between 10-4000 nm. The III-nitride region may have a doping concentration between $1\times10^{17}$ cm$^{-3}$-$5\times10^{20}$ cm$^{-3}$.

Preferably an intermediate layer of undoped III-nitride material is deposited over the doped material before it is porosified. The intermediate layer preferably has a thickness of between 1 nm and 3000 nm, preferably between 5 nm and 2000 nm. As the intermediate layer is undoped, it remains non-porous after the porosification step, which advantageously provides a good surface for epitaxial overgrowth of further layers of semiconductor.

In preferred embodiments, the doped region consists of an alternating stack of doped and undoped layers. In preferred embodiments the stack contains between 5-50 pairs of layers. The thickness of each highly doped layer may vary between 10 nm-200 nm and low-doped or undoped layers may have a thickness of between 5-180 nm.

As is known in the art, electrochemical porosification removes material from n-type doped regions of III-nitride materials, and creates empty pores in the semiconductor material.

In preferred embodiments, the LED structure is formed over a stack of multiple porous layers of III-nitride material. Thus, rather than being a single porous layer of III-nitride material, the porous region may be a stack of layers of III-nitride material in which at least some layers are porous. The stack of porous layers may preferably be a stack of alternating porous and non-porous layers.

The method may preferably comprise the step of depositing one or more connecting layers of III-nitride material on the surface of the intermediate layer of III-nitride material prior to overgrowing the n-doped region, the LED light emitting region and the p-doped region on the connecting layer.

Alternatively, where there is no non-porous intermediate layer over the porous region, the method may comprise the step of depositing a connecting layer of III-nitride material onto the surface of the porous region of III-nitride material.

The method may comprise the further step of overgrowing the n-doped region, the LED light emitting region and the p-doped region on the connecting layer.

The LED produced by the method of manufacture is preferably a LED according to one of the first to sixth aspects of the invention.

Features described herein in relation to one aspect of the invention are equally applicable to the other aspects of the invention.

BRIEF DESCRIPTION OF THE DRAWINGS

Embodiments of the invention will now be described with reference to the figures, in which:

FIG. 1 illustrates a porous template suitable for a LED according to the present invention.

The porous template comprises a porous region of III-nitride material on a substrate, with a non-porous layer of III-nitride material arranged over the top surface of the porous region. Optionally there may be further layers of III-nitride material between the substrate and the porous region.

As described in more detail below, the porous region may be provided by epitaxially growing an n-doped region of III-nitride material and then an undoped layer of III-nitride material, and porosifying the n-doped region using the porosification process as set out in international patent applications PCT/GB2017/052895 (published as WO2019/063957) and PCT/GB2019/050213 (published as WO2019/145728).

As described above, this porosification leads to strain relaxation in the crystal lattice, which means that subsequent overgrowth of further semiconductor layers benefit from reduced compressive strain in their lattices.

The porous region may comprise one or more layers one or more III-nitride materials, and may have a range of thicknesses, all while still providing the strain relaxation benefit that shifts the wavelength of InGaN light emitting layers overgrown above the porous region. In preferred embodiments, the porous region may for example comprise GaN and/or InGaN.

Figure 1:
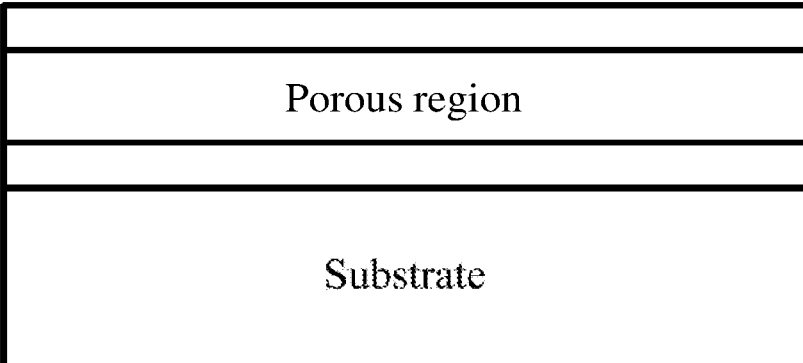
FIG. 1 illustrates a porous template suitable for an LED according to the present invention.

A variety of LED structures may be overgrown over the template illustrated in FIG. 1.

In particular, LED structures containing InGaN light emitting layers, which are known in the art for the manufacture of yellow or green LEDs, may be overgrown on the porous template using standard LED manufacturing steps. When grown on the porous template, however, a LED structure which normally emits at a first wavelength, will emit at a red-shifted longer wavelength.

In this way, the use of a porous region of III-nitride material as a template or pseudo-substrate for overgrowth of known InGaN LED structures allows longer-wavelength LEDs to be manufactured in a straightforward manner.

In a preferred embodiment, a LED according to the present invention comprises the following layers, and may be manufactured using the step by step process described below.

The following description of the LED structure relates to a Top emission architecture being described from the bottom up, but the invention is equally applicable to a bottom emission architecture.

Figure 2:
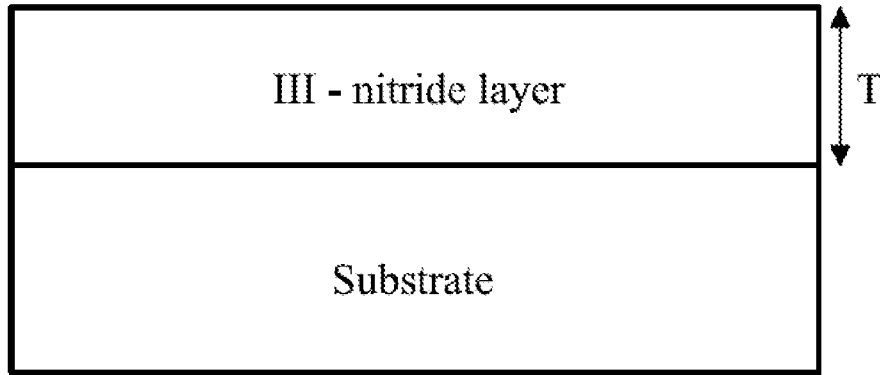
FIGS. 2~illustrate the steps of manufacturing an LED according to a preferred embodiment of the present invention.

FIG. 2—Substrate & III-Nitride Layer for Porosification

A compatible substrate is used as a starting surface for epitaxy growth. The substrate may be Silicon, Sapphire, SiC, β-Ga2O3, GaN, glass or metal. The crystal orientation of the substrates can be polar, semi-polar or non-polar orientation. The substrate size may vary from 1 cm$^2$, 2 inch, 4 inch, 6 inch, 8 inch, 12 inch, 16 inch diameters and beyond, and the substrate may have a thickness of greater than 1 μm, for example between 1 μm and 15000 μm.

A layer or stack of layers of III-nitride material is epitaxially grown on the substrate. The III-nitride layer may contain one or a combination of these elements: Al, Ga, In (binary, ternary or quaternary layer).

The thickness T of the III-nitride stack is preferably at least 10 nm, or at least 50 nm, or at least 100 nm, for example between 10-10000 nm.

The III-nitride layer comprises a doped region having an n-type doping concentration between $1 \times 10^{17}$ cm$^{-3}$-$5 \times 10^{20}$ cm$^{-3}$. The III-nitride layer may also comprise an undoped "cap" layer of III-nitride material over the doped region.

The doped region may terminate at the exposed upper surface of the III-nitride layer, in which case the surface of the layer will be porosified during electrochemical etching.

Alternatively, the doped region of the III-nitride material may be covered by an undoped "cap" layer of III-nitride material, so that the doped region is sub-surface in the semiconductor structure. The sub-surface starting depth (d) of the doped region may be between 1-2000 nm for example.

Figure 3:
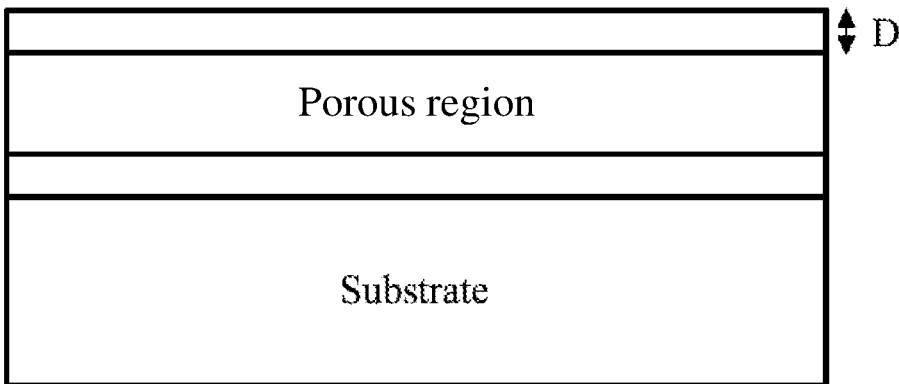

FIG. 3—Porosification to Porous Region

After it is deposited on the substrate, the III-nitride layer (or stack of layers) is porosified with a wafer scale porosification process as set out in international patent applications PCT/GB2017/052895 (published as WO2019/063957) and PCT/GB2019/050213 (published as WO2019/145728). During this process, the doped region of the III-nitride material becomes porous, while any undoped region of III-nitride material does not become porous.

Following the porosification step, the structure therefore contains a porous region which remains where there was previously n-doped III-nitride material, and optionally a non-porous intermediate layer overlying the porous region.

The degree of porosity of the porous region is controlled by the electrochemical etching process and may be between 1%-99% porosity, preferably between 20% to 90% porosity or between 30%-80%, though lesser or greater porosities could also be employed.

The thickness of the porous region following porosification is preferably greater than 1 nm, more preferably greater than 10 nm, particularly preferably at least 40 nm or 50 nm or 100 nm. However, the thickness of material required to obtain the strain relaxation benefit provided by the porous region may vary depending on the type of III-nitride material from which the porous region is made.

The porous region created by the porosification process may be a bulk layer of a III-nitride material having a uniform composition and a uniform porosity throughout the layer. Alternatively the porous region may comprise multiple layers of porous material of different compositions and/or porosities, forming a porous stack of III-nitride material. For example the porous region may be a continuous layer of porous GaN, or a continuous layer of porous InGaN, or a stack comprising one or more layers of porous GaN and/or one or more layers of porous InGaN. The inventors have found that the strain relaxation benefit of the porous region for overgrowth is obtainable across a wide range of porous regions having different thicknesses, compositions, and layered stacks.

In the embodiment illustrated in the Figures, the porous region is a single porous layer.

Where there is an undoped cap layer of III-nitride material over the doped region, the undoped region remains non-porous following through-surface porosification of the doped region below. The thickness D of this non-porous cap layer may preferably be at least 2 nm, or at least 5 nm, or at least 10 nm, preferably 5-3000 nm. Providing an undoped cap layer over the doped region advantageously leads to a non-porous layer of III-nitride material covering the porous region following porosification. This non-porous cap layer may advantageously allow better overgrowth of further material above the porous region.

As the porosification method of PCT/GB2017/052895 (published as WO2019/063957) and PCT/GB2019/050213 (published as WO2019/145728) can be carried out on entire semiconductor wafers, no processing/patterning/treatment is needed to prepare the template for porosification.

Figure 4:
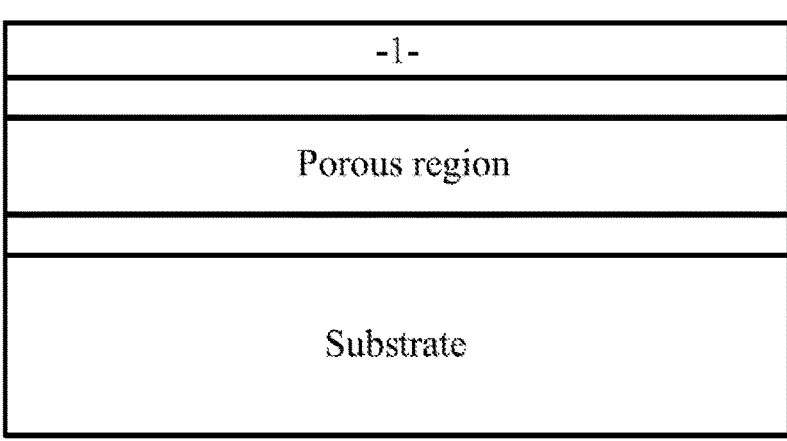

FIG. 4—Connecting Layer

After formation of the porous layer, a III-nitride LED epitaxy structure can be grown onto the porous template/pseudo-substrate provided by the porous layer and the non-porous cap layer.

The first layer for growth of the LED structure onto the template may be termed a connecting layer 1.

Although it is possible for an LED epitaxial structure to be grown directly onto the non-porous cap layer, it is preferable that a connecting layer 1 is provided over the cap layer before overgrowth of the LED structure. The inventors have found that the use of a III-nitride connecting layer 1 between the porous region and the LED epitaxy structure may advantageously ensure a good epitaxial relationship between the LED and the porous template/substrate. The growth of this layer makes sure that subsequent overgrowth on top of the connecting layer is smooth and epitaxial and suitably high quality.

The connecting layer 1 is formed of III-nitride material and may contain one or a combination of these elements: Al, Ga, In (binary, ternary or quaternary layer).

The connecting layer can be a doped or un-doped layer. The connecting layer can optionally be doped with suitable n-type dopant materials, e.g Si, Ge, C, O. The III-nitride layer may have a doping concentration between $1\times10^{17}$ cm$^{-3}$-$5\times10^{20}$ cm$^{-3}$.

The thickness of this connecting layer is preferably at least 100 nm, and can be for example between 100-10000 nm.

Figure 5:
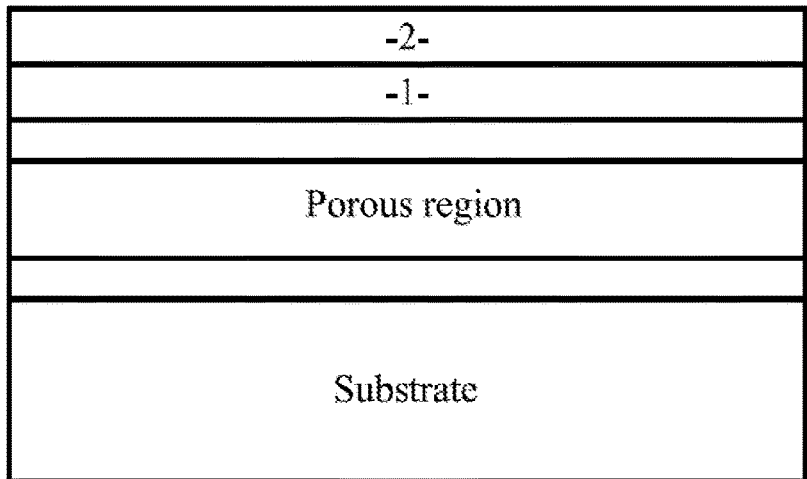

FIG. 5—N-Doped Region

After the growth of the connecting layer, a bulk n-doped III-nitride region 2 is grown.

The n-doped region 2 may comprise or consist of a III-nitride layer containing Indium, or a stack of thin III-nitride layers with or without indium, or a bulk layer or stack of III-nitride layers with a variation in atomic percentage of indium across the layer or stack is grown. For example, the n-doped region may be a layer of n-GaN, or a layer of n-InGaN, or alternatively the n-doped region may be a stack of n-GaN/n-InGaN alternating layers, or a stack of n-InGaN/n-InGaN alternating layers having different quantities of indium in alternating layers.

Preferably the n-doped region 2 comprises indium, so that the crystalline lattice of the n-doped region has similar lattice parameters to the lattice of the InGaN light emitting layer in the LED. The Indium atomic percentage in the n-doped region may vary between 0.1-25% for example.

In preferred embodiments, the indium content of the n-doped region is within 20 at %, or within 15 at %, or within 10 at %, or within 5 at % of the indium content of the InGaN light emitting layer. This may advantageously ensure that the lattice parameters of the n-doped region are sufficiently similar to those of the InGaN light emitting layer to avoid excessive strain between these layers.

The total thickness of the n-doped region may be at least 2 nm, or at least 5 nm, or at least 10 nm, or at least 20 nm. The thickness of the n-doped region may vary between 2 nm-5000 nm, or even thicker, for example. If the n-doped region comprises a stack of layers, the thickness of each individual layer in the stack is preferably between 1-40 nm.

The n-doped region preferably has an n-type doping concentration between $1\times10^{17}$ cm$^{-3}$-$5\times10^{20}$ cm$^{-3}$, preferably between $1\times10^{18}$ cm$^{-3}$-$5\times10^{20}$ cm$^{-3}$, particularly preferably greater than $1\times10^{18}$ cm$^{-3}$.

Figure 6:
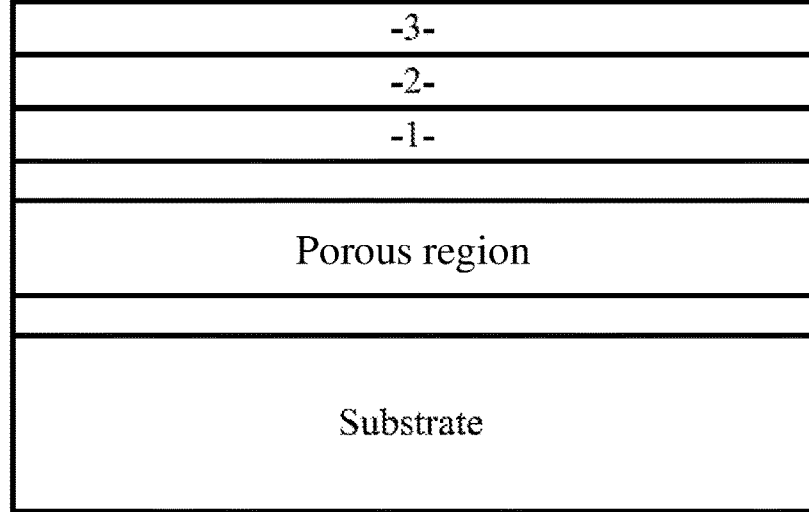
Figure 7:
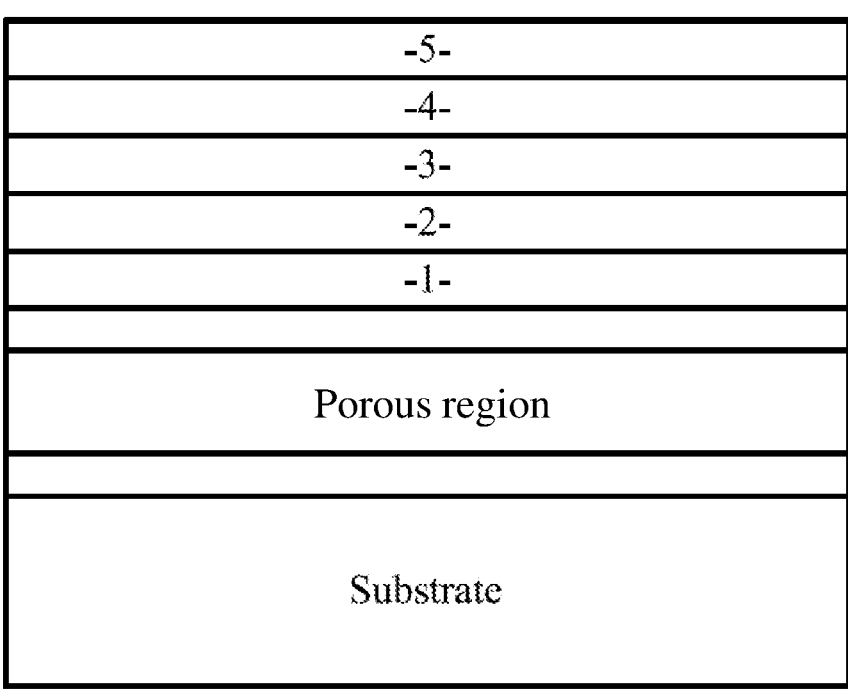

FIG. 6—Light Emitting Region

After growth of the n-doped region 2, an underlay or pre-layer or pre-well (not labelled in FIG. 6) may be grown, in order to release the strain in the light emitting layer(s). The underlay can be a single layer or stack/multi-layers of GaN, InGaN, or GaN/InGaN, or InGaN/InGaN. Alternatively, the underlay may have a structure similar to InGaN QW/GaN quantum barrier but with a lower proportion of indium. For example, before depositing the light emitting layer having a relatively high proportion of indium, an underlay consisting of a layer of bulk InGaN having a lower proportion of indium than the light emitting layer may be grown. Alternatively, the underlay may take the form of an InGaN "dummy" QW with a lower proportion of indium than the light emitting layer, and one or more GaN quantum barriers.

After growth of the n-doped region 2 and optionally the underlay, a light emitting region 3 containing an InGaN light emitting layer is grown.

The light emitting region 3 may contain at least one InGaN light emitting layer. Each InGaN light emitting layer may be an InGaN quantum well (QW). Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum wells consists of an InGaN layer with atomic indium percentage between 15-40%. Preferably the light-emitting indium gallium nitride layer(s) and/or the quantum wells have the composition In$_x$Ga$_{1-x}$N, in which $0.05\leq x\leq 0.35$, preferably $0.12\leq x$ 0.30 or $0.22\leq x\leq 0.30$, particularly preferably $0.22\leq x\leq 0.27$.

The thickness of each quantum well layer may be between 1.5-8 nm, preferably between 1.5 nm and 6 nm, or between 1.5 nm and 4 nm. The quantum wells may be capped with a thin (0.5-3 nm) III-nitride QW capping layer, which may contain one or a combination of these elements: Al, Ga, In (ternary of quaternary layer)

The QW capping layer, which is the layer added immediately after QW growth, can be AlN, AlGaN of any Al % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer). The QW barrier can be AlN, AlGaN of any Al % 0.01-99.9%, GaN and InGaN of any In % 0.01-15%. Preferably the QW barrier layers contain AlN and/or AlGaN.

The QW capping layer(s) and QW barriers are not indicated with individual reference numerals in the Figures, as these layers form part of the light emitting region 3.

The QW capping layers may be grown after each QW but before the barrier growth. For example, if an LED contains 3 QWs then each of these QWs may be overgrown with a QW capping layer and then a QW barrier layer, so that the light emitting region contains 3 such QW capping layers and three such QW barrier layers.

1. One can grow the cap at the same conditions as the QW.
2. One can ramp without growth to higher temperature, and grow this cap (effectively this is an annealing step) and here the ramp can be carried out in a different gas mixture.
3. One can ramp and grow during the temperature ramp.

The design of the light-emitting region may be varied according to parameters that are well understood in the art and conventional in LED design. For example, depending on the target EL emission wavelength of the LED, the composition, thickness and number of light-emitting layers and barrier layers may be varied. As described earlier in the application, the indium content of InGaN light-emitting layers may be increased when longer-wavelength emission is desired.

As described above, the present invention may be provided by growing a known LED structure, known to emit at a first wavelength under electrical bias, over a template containing a porous region. The strain relaxation caused by the porous region beneath the LED structure enables incorporation of more indium into the light-emitting layer(s) under the same growth conditions, so the wavelength of the resulting LED is red-shifted when compared to the same LED structure grown under the same conditions over a non-porous substrate. A greater variety of emission wavelengths may therefore be achieved using the present invention than has been possible in the prior art, and in particular, longer wavelengths can be achieved at higher InGaN growth temperatures. This leads to superior quality crystal structures in the LED, and thus higher performance LEDs.

For the manufacture of longer-wavelength LEDs the large amount of Indium in the light emitting layer(s) makes the capping layer even more important, as previous attempts to manufacture longer wavelength yellow, orange or red LEDs have failed due to not enough Indium being incorporated. So capping is very important to make sure that there is sufficient Indium trapped within the light emitting region.

FIG. 7—Cap Layer

After growth of the light emitting layer(s) a non-doped cap layer 4 is grown. Non-doped cap layer 4 may be termed a light-emitting-region cap layer, as this layer is formed after growth of the complete light emitting region, for example after the growth of the stack of QWs, QW capping layers and QW barrier layers.

The cap layer (light-emitting-region cap layer) 4 is a standard layer which is very well known in the growth schemes for III-nitride LEDs.

The thickness of the cap layer can be between 5-30 nm, preferably between 5-25 nm or 5-20 nm.

The purpose of the light-emitting-region cap layer 4, is to protect the indium in the light emitting region (QW stack) and prevent it from desorbing/evaporating during subsequent processing. Because the InGaN QW is normally grown at lower temperature, that is not favourable for GaN/AlGaN, there is typically a temperature ramp step needed before further layers can be overgrown above the light emitting region. The cap layer is used to ensure that the InGaN light emitting layer(s) are properly capped and protected, so that there is a chance and time window to change the p-doped layer growth conditions for better material quality. The light-emitting-region cap layer 4 also ensures that no Mg dopant is entering the QW region during the growth of p-type layers.

Electron Blocking Layer (EBL)

After the growth of quantum wells, capping and barrier layers, an electron blocking III-nitride layer (EBL) 5 containing Aluminium is grown. The Al % can be between 5-25% for example, though higher Al content is possible.

The EBL is doped with a suitable p-type doping material. The p-type doping concentration of the EBL is preferably between $5\times1^{18}$ cm$^{-3}$-$8\times10^{20}$ cm$^{-3}$ The thickness of the EBL can be between 10-50 nm, preferably 20 nm.

Figure 8:
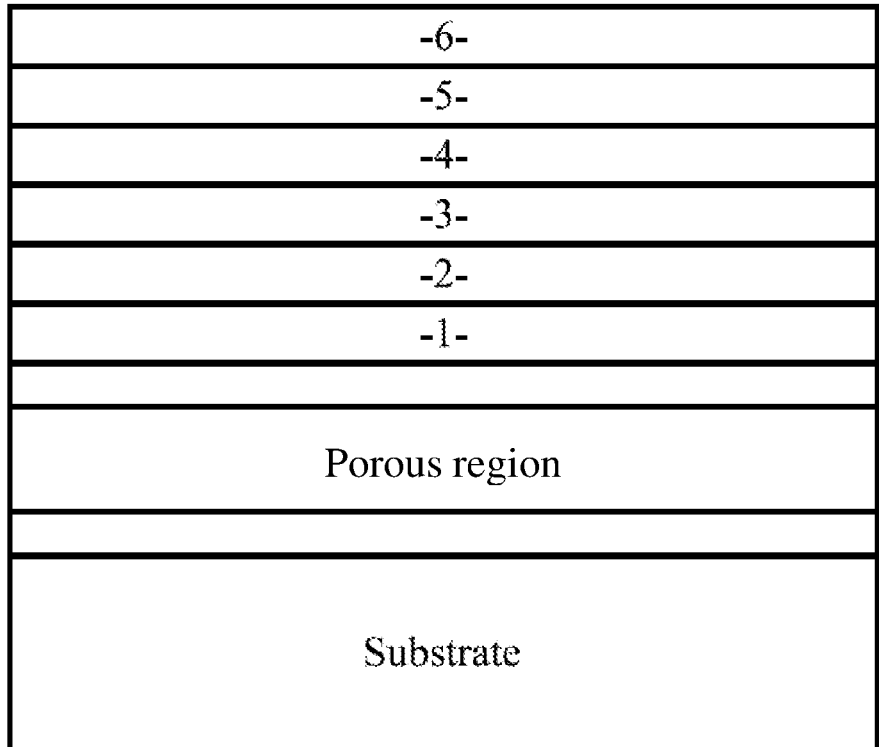

FIG. 8—P-Doped Layer

A p-doped layer 6 is grown above the electron blocking layer (EBL) 5.

The p-type region is preferably doped with Mg, and the p-type doping concentration of the p-type layer is preferably between $5\times10^{18}$ cm$^{-3}$-$8\times10^{20}$ cm$^{-3}$.

The p-doped III-nitride layer may contain In and Ga.

The doping layer is preferably between 20-200 nm thick, particularly preferably between 50-100 nm thick. The doping concentration may vary across the p-type layer and can have a spike in doping levels in the last 10-30 nm of the layer towards the LED surface, in order to allow better p-contact.

For activation of Mg acceptors in the p-doped layer, the structure may be annealed inside of MOCVD reactor or in an annealing oven. The annealing temperature may be in the range of 700-850° C. in N$_2$ or in N$_2$/O$_2$ ambient.

As both the EBL and the p-doped layer are p-type doped, these layers may be referred to as the p-doped region.

Figure 9:
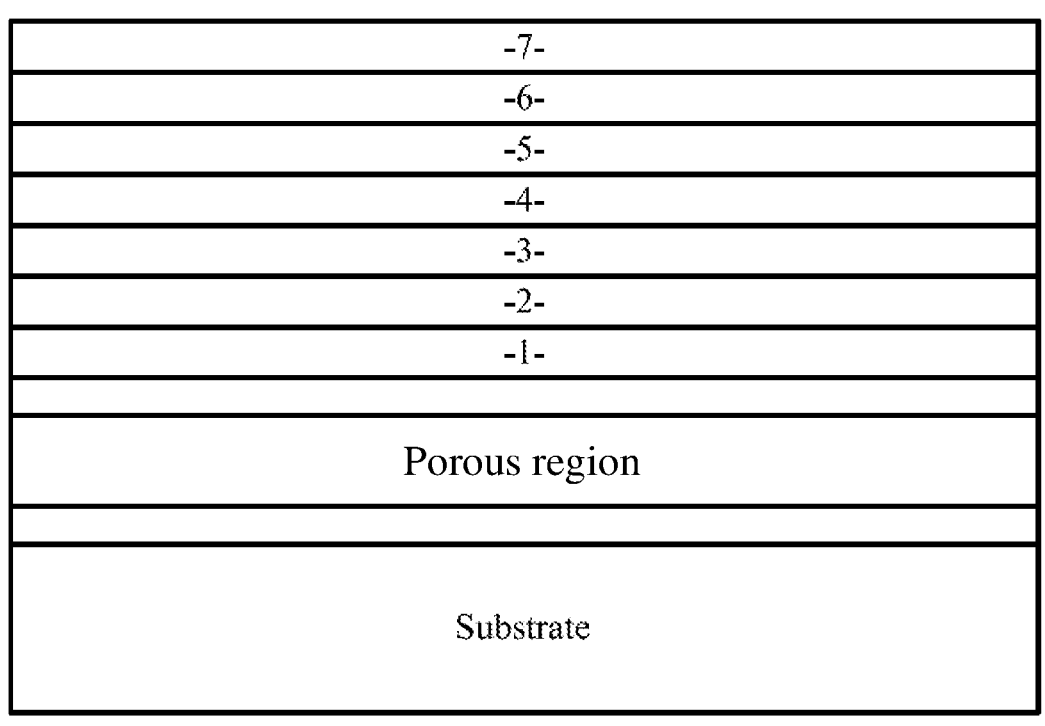

FIG. 9—Transparent Conducting Layer

The stack of active semiconductor layers is covered with a transparent conducting layer 7. The transparent conducting layer can be made of Ni/Au, indium tin oxide, indium zinc oxide, graphene, Pd, Rh, silver, ZnO etc., or a combination of these materials.

The thickness of the transparent conducting layer can be between 10-250 nm.

Transparent conducting layers are well known in the art, and any suitable material and thickness may be used.

An annealing step may be required for making the p-contact ohmic.

FIG. 10

Depending on the LED structure being manufactured, the semiconductor structure may be processed into LED, mini-LED or micro-LED devices.

Normal LEDs are typically larger than 200 μm (referring to the lateral dimensions of width and length of the LED structure. Mini-LEDs are typically 100-200 μm in lateral size, while Micro-LEDs are typically less than 100 μm in size.

Figure 10:
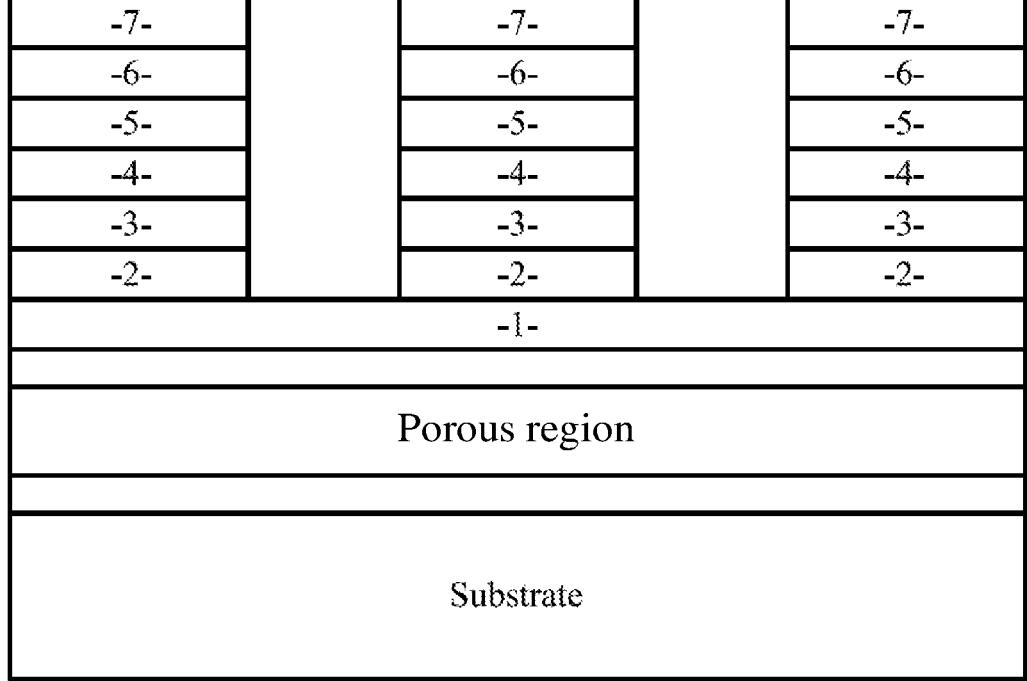

FIG. 10 onwards illustrates the semiconductor structure following etching of layers 2-7 of the semiconductor structure into multiple discrete LED stacks, or mesas, each having the same structure.

The steps of LED fabrication are conventional and well-known to those skilled in the art. The order of the following fabrication steps are not specific to the present invention, and the skilled person will be appreciated that LED devices within the scope of the present invention may be prepared using alternative fabrication steps to those illustrated below. For the purposes of illustration only, however, one preferred fabrication route to prepare LEDs according to the present invention is described below.

In the next step, the transparent conducting layer 7 is structured in such a way that it covers only the top surface of the active emission element. The structuring can be done using standard semiconductor processing methods that included resist coating and photolithography. The transparent conducting layer is etched by using wet chemistry or a sputter etch process using Argon. This step is followed by wet or dry etching of the III-nitride structure. An inductively couple plasma reactive ion etching, only reactive ion etching or neutral beam etching is used to create mesas in the III-nitride layer. The dry etch process may include either one or more of Cl, Ar, BCl$_3$, SiCl$_4$ gases.

The purpose of this step is to isolate the individual emitting elements and access the buried n-doped layer of the p-n junction.

After the dry etch process a wet etch process is done to remove the dry etching damage from the sidewalls of the mesa. The wet chemistry may involve KOH (1-20%), TMAH or other base chemistries.

Figure 11:
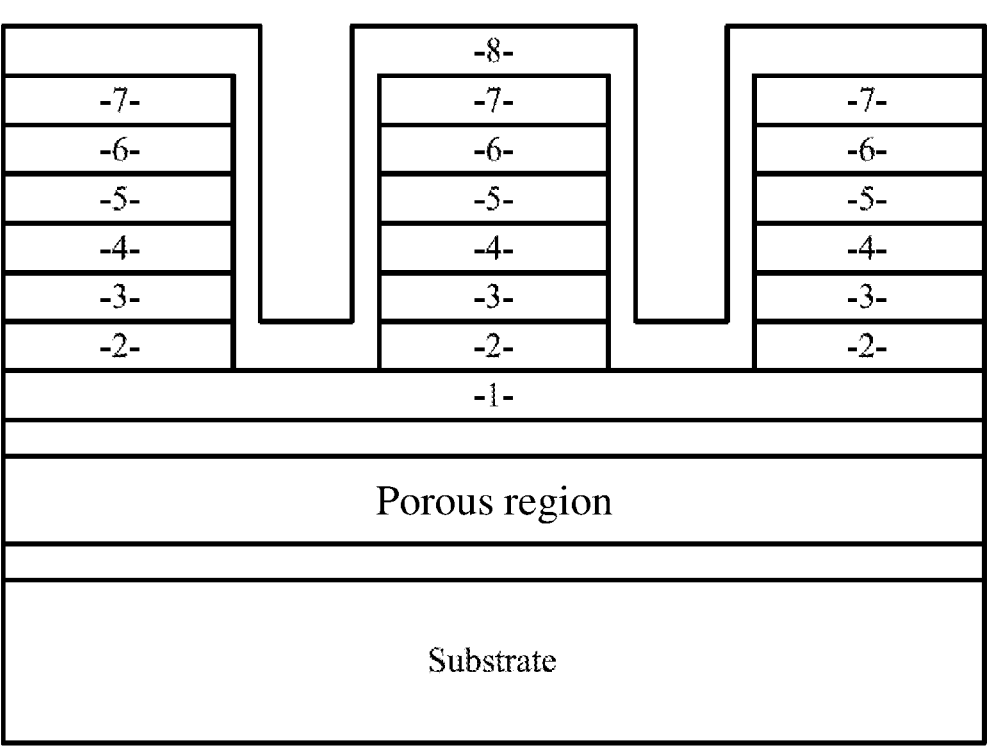
Figure 12:
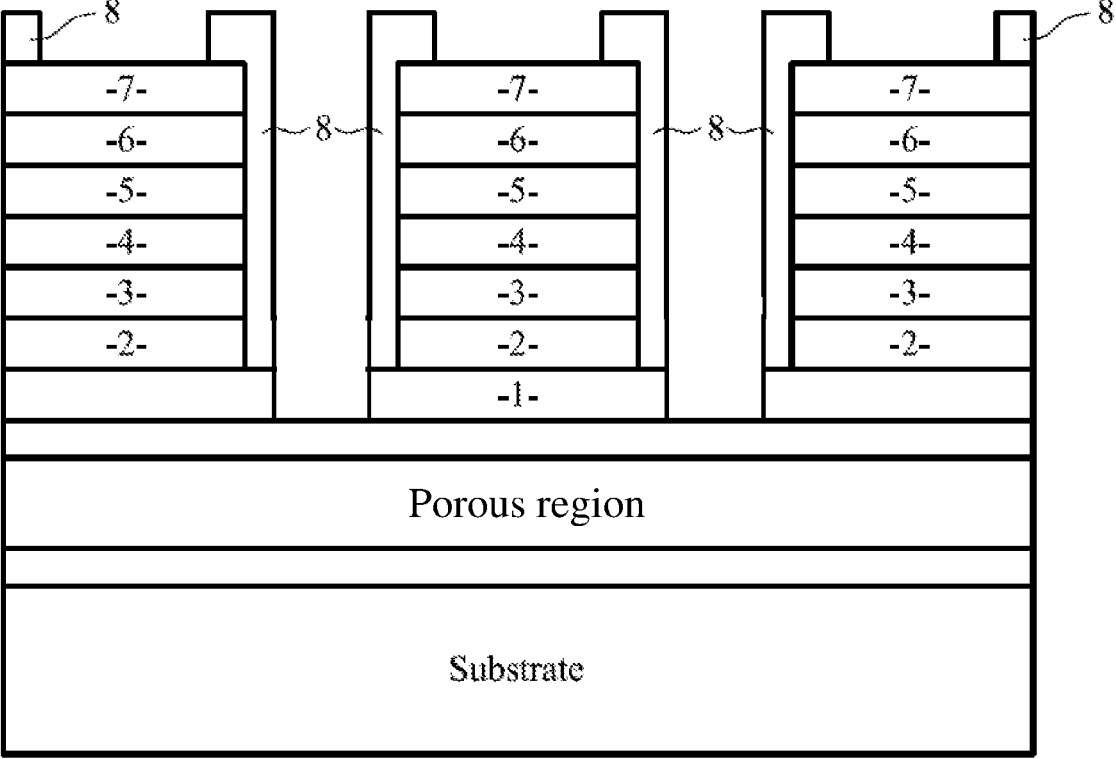
Figure 13:
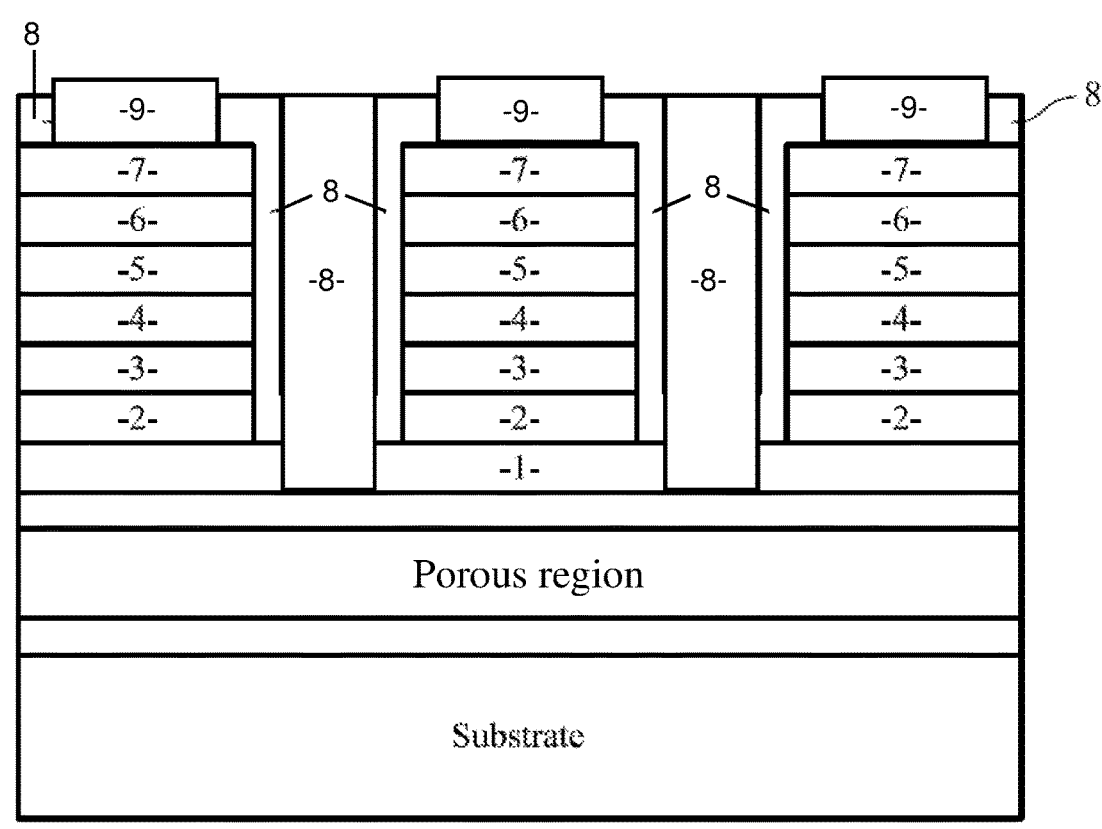

FIG. 11—Passivation

The next step is to deposit a passivation layer 8 or a combination of passivation layers. The starting passivation layer can be Al2O3 (10-100 nm) (deposited by atomic layer depositions) followed by sputtered or plasma enhanced chemical vapor deposited SiO2, SiN or SiON (50-300 nm).

The Al2O3 can be deposited between 50-150° C.

The SiO2, SiN and SiON can be deposited between 250-350° C.

The sputter process can be done at room temperature.

FIGS. 12-13

The next step is to create openings in the oxide passivation layer 8 to expose the top of the LED structure. This can be done via wet or dry etching or a combination of both.

For wet etching buffered oxide etch, diluted hydrofluoric acid phosphoric acid or a mixture of these can be used.

Channels are also etched through the connecting layer 1 between the LED structures, followed by electrically isolating the LED structures from one another by depositing dielectric mask material 8 into the channels, so that the LEDs are operable independently from one another.

The next step in device fabrication is to cover the transparent conducting layers 7 on the p-doped layers 6 with metal layers to act as electrical p-contacts. The covering can be done with a single step or multiple steps. The metals can be covering the pixels completely or partially. In this example a single step is used to simplify the details.

The metal may contain Ti, Pt, Pd, Rh, Ni, Au. The thickness of the complete metal stack can be between 200-2000 nm.

Figure 14:
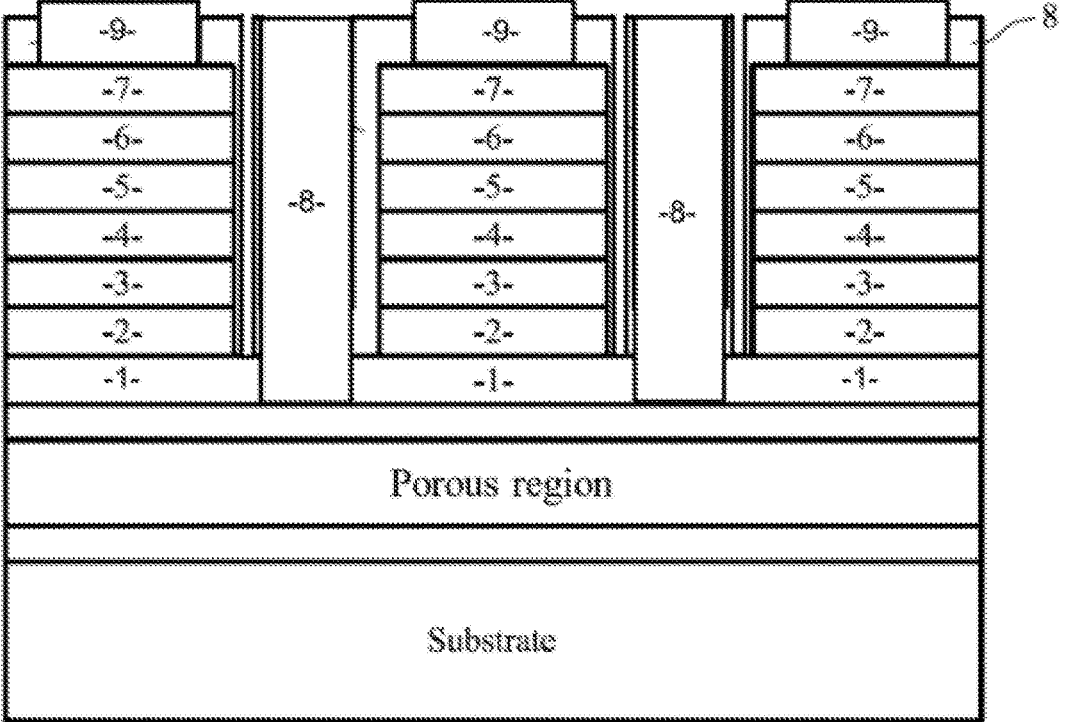
Figure 15:
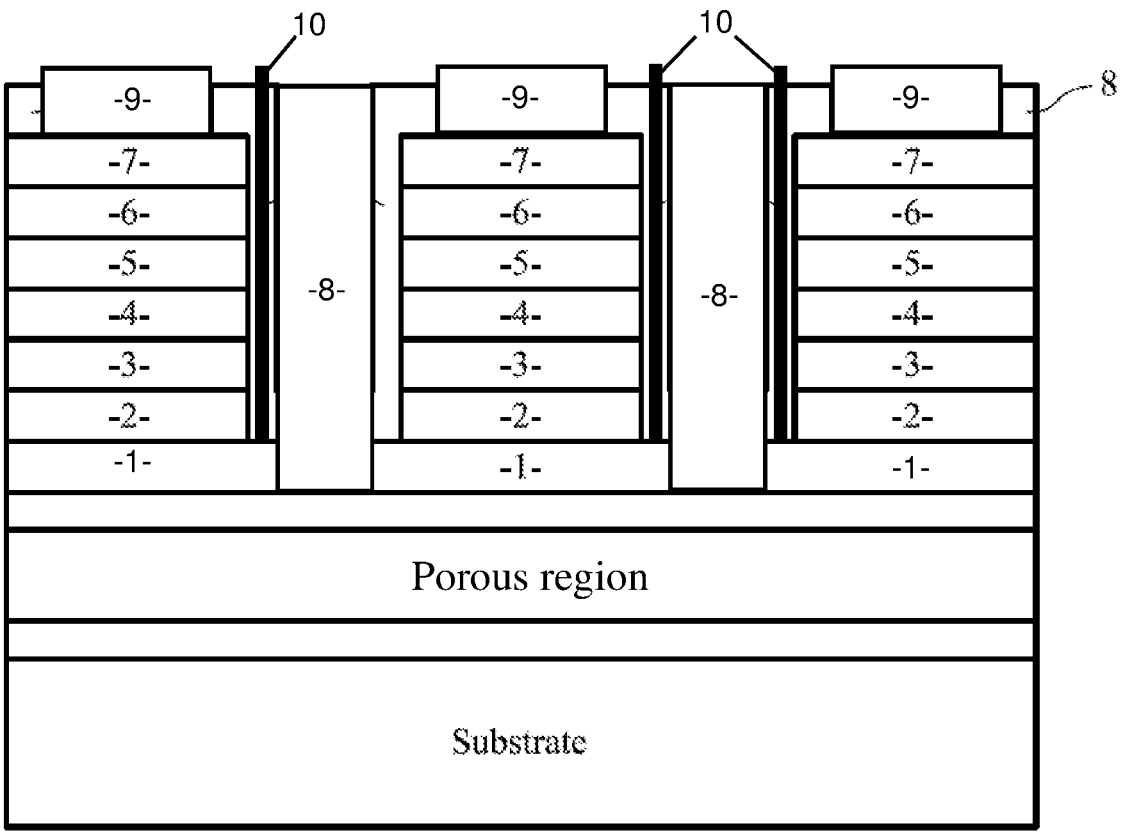

FIG. 14—Exposing Connecting Layer

Standard photolithography techniques can be used to create openings in the second mask layer 8 to expose a plurality of regions of the connecting layer 1. The size of the openings can vary between 200 nm-50000 nm. This distance between the openings can be between 500 nm-30000 nm. The opening are creating only in the regions of the wafer that are not occupied by LED structures.

Dry etching is preferably used to etch the second mask layer 8 using fluorine based gases.

FIG. 15—N-Contacts

The next step in device fabrication is to cover the openings in the oxide 8 with metal contacts 10 to access the connecting layer 1, which is in electrical contact with the n-doped layers of the LED structures. The covering can be done with a single step or multiple steps. The metals can be covering the pixels completely or partially. In this example a single step is used to simplify the details.

The metal may contain Ti, Pt, Pd, Rh, Ni, Au. The thickness of the complete metal stack can be between 200-2000 nm.

FIGS. 16-18

After this processing, the substrate can be thinned, and/or the porous region can be removed so that the connecting layer 1 is exposed.

Surface structuring or texturing can be done on the substrate, at the porous region, or layer 1 to enhance the light output and control the emission angle, as well as other optical engineering and design.

Finally, the wafer/devices can be flipped, and bonded to another carrier substrate either can be silicon/sapphire or any type as passive devices, alternatively, the devices can be bonded to a CMOS silicon backplane for active matrix micro-LED display panel.

Figure 16:
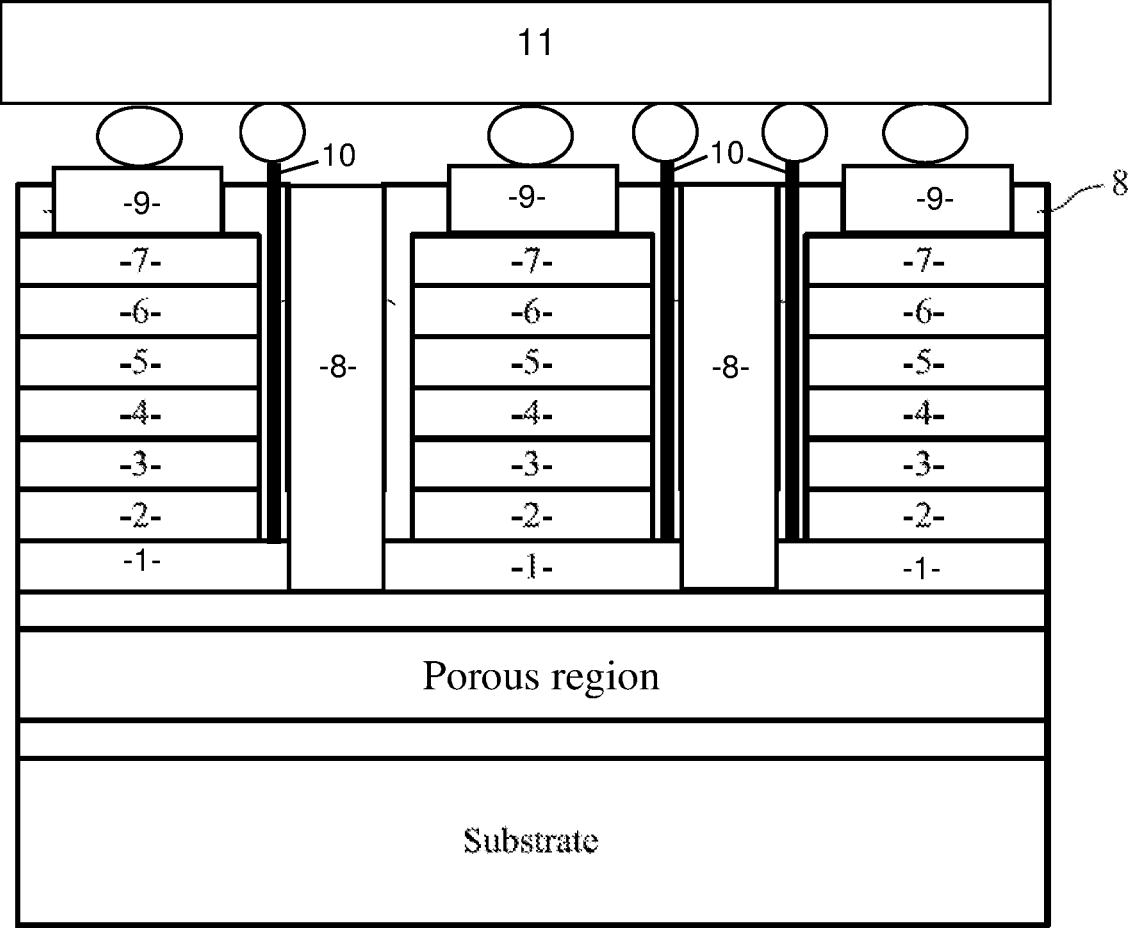

As shown in FIG. 16, the top side of the device may be bonded to another carrier wafer/substrate/backplane 11, or to a microdriver circuit board to form an array of pixels.

Figure 17:
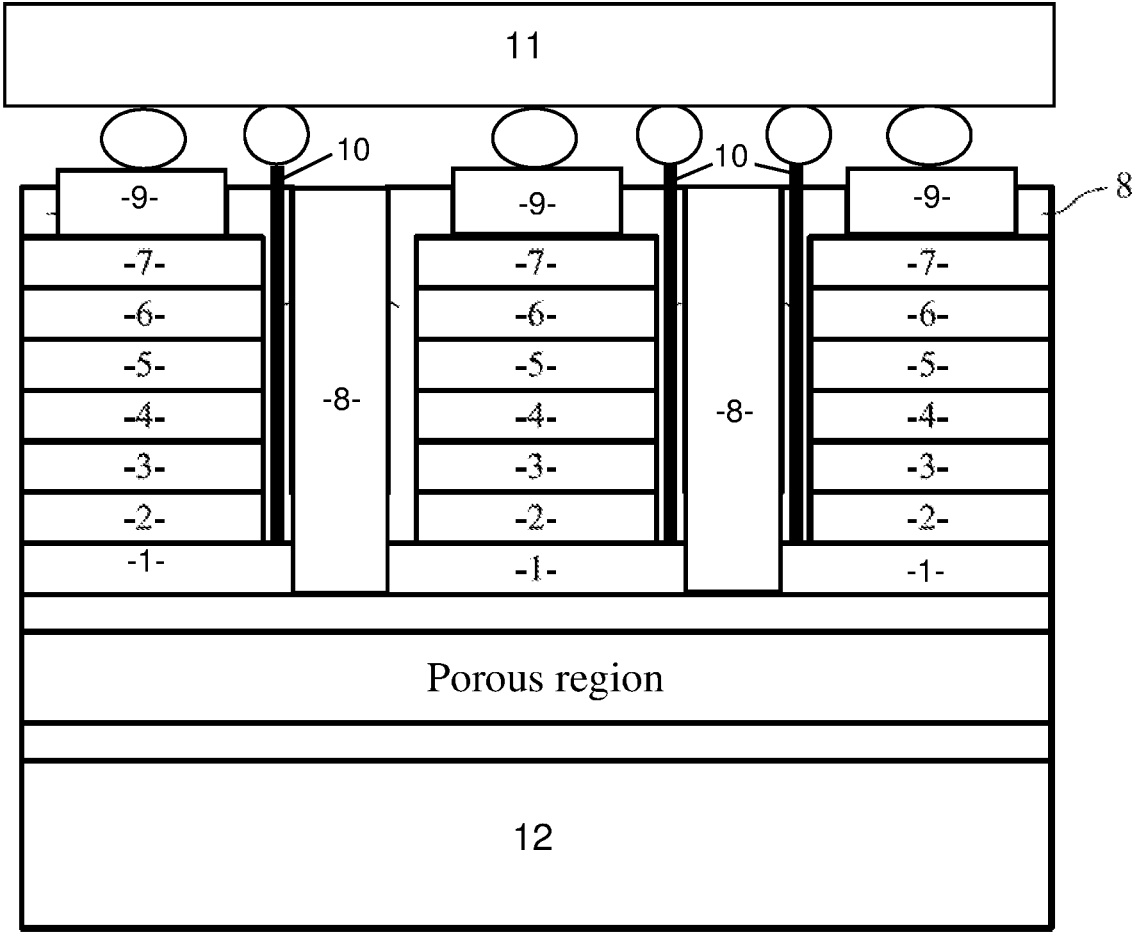

As shown in FIG. 17, the substrate may then be removed from the device, and the bottom-side of the device may be bonded to a cover glass or transparent material 12.

Figure 18:
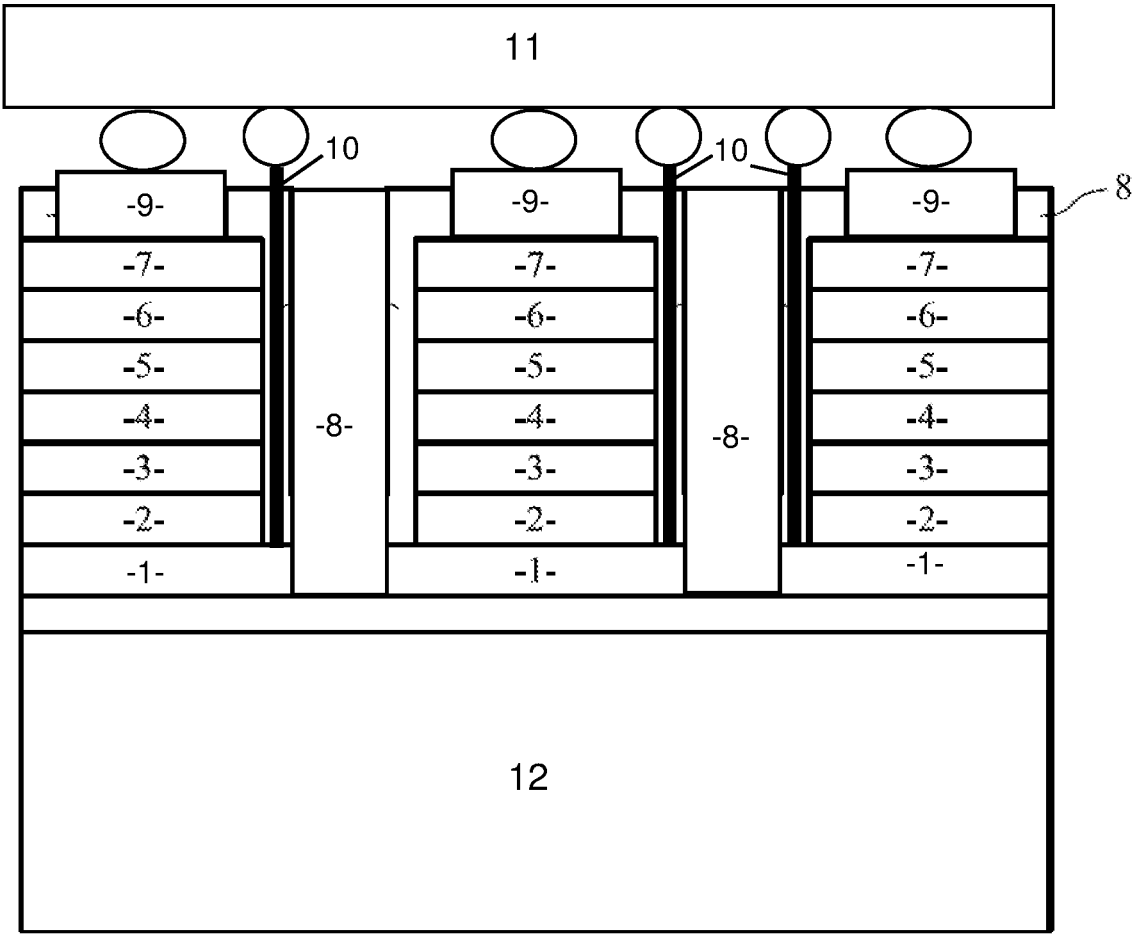

As shown in FIG. 18, the substrate and the porous and non-porous region may be removed from the device. The top side of the device may be bonded to another carrier wafer/substrate/backplane 11, or to a microdriver circuit board to form an array of pixels. The bottom-side of the device may be bonded to a cover glass or transparent material 12.

The skilled person will understand that the emission wavelengths of the individual LED structures may be controlled by altering the composition and layer structures of the LED structures according to known principles of LED construction. Thus a variety of variable-wavelength LED devices emitting over different emission wavelength ranges may be provided using the present invention, and colour combinations other than green to red may be provided.

FIGS. 19-23

Figure 19:
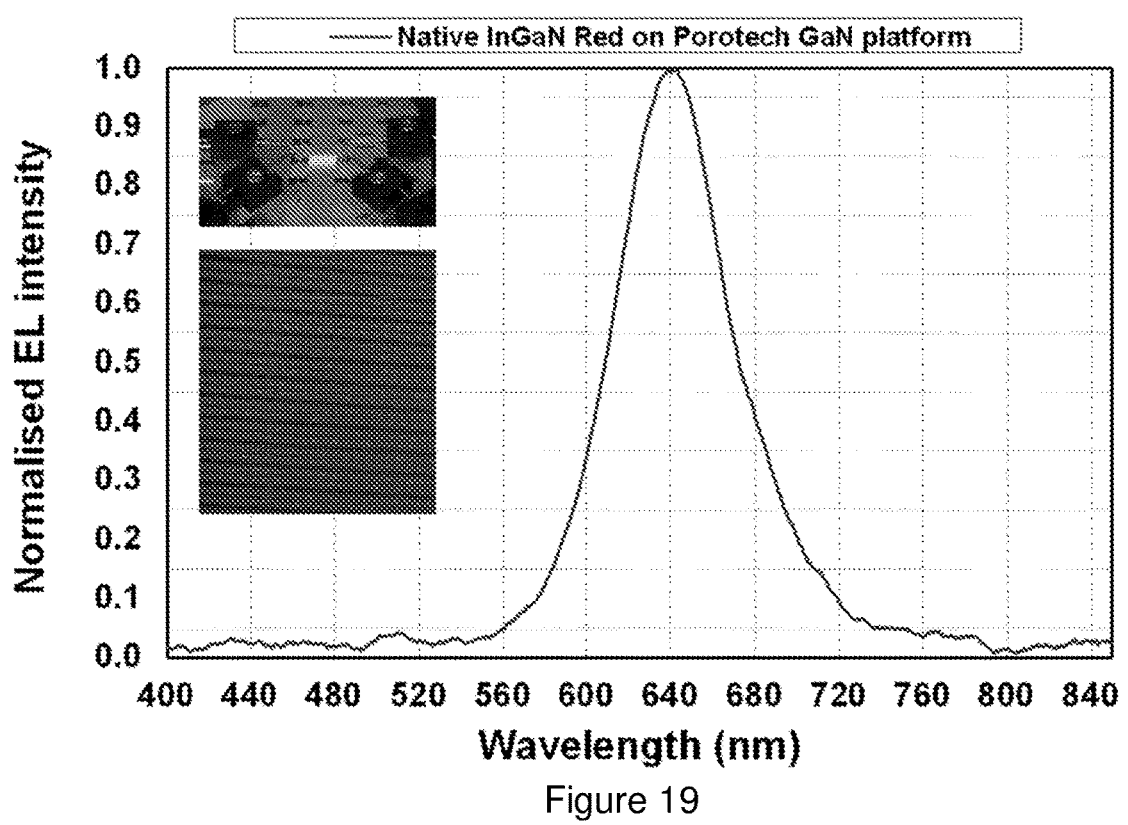
FIG. 19 is a graph of normalised electroluminescence (EL) intensity vs wavelength, for an InGaN LED over a porous region.

FIG. 19 shows an example of an InGaN LED over a porous layer that emits at a peak wavelength of around 625 nm due to the wavelength red-shift caused by the porous region.

Figure 20:
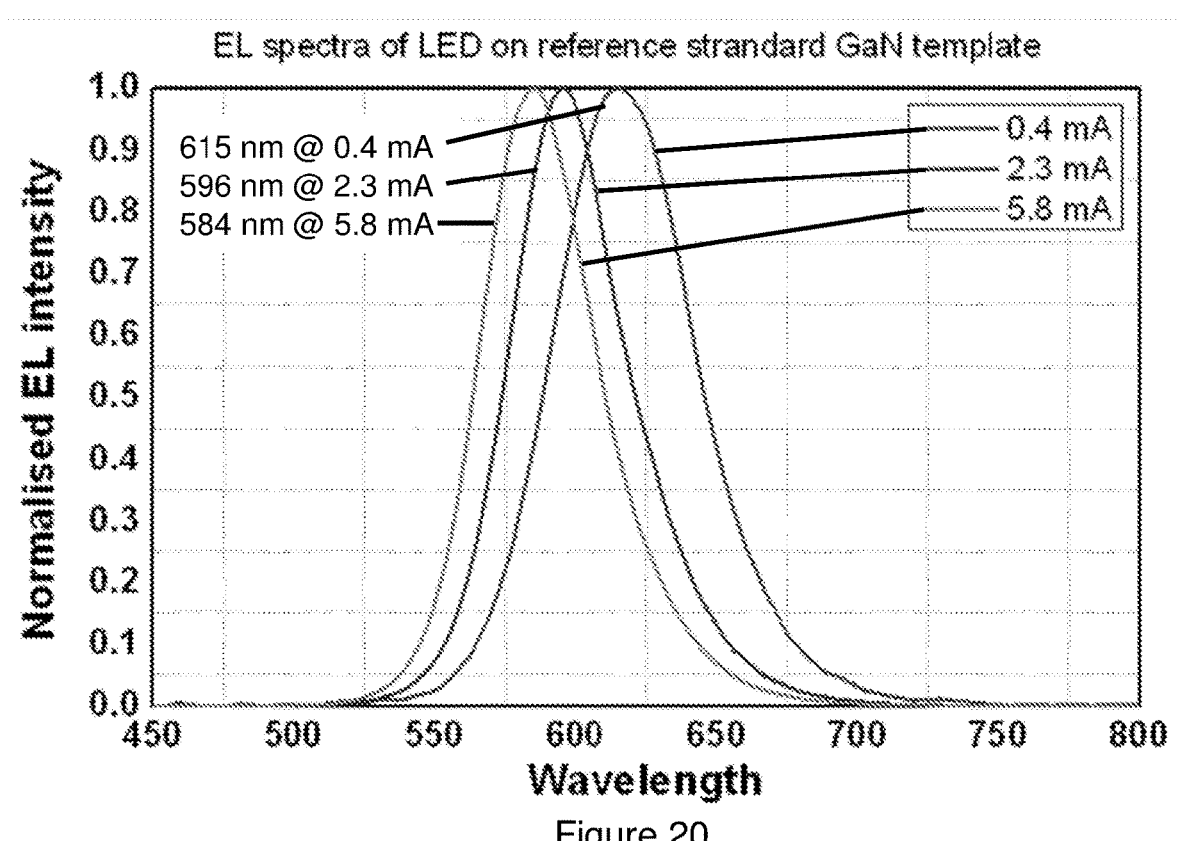
FIG. 20 is a graph of normalised electroluminescence (EL) intensity vs wavelength at different current injections, for an InGaN LED on a non-porous substrate.
Figure 21:
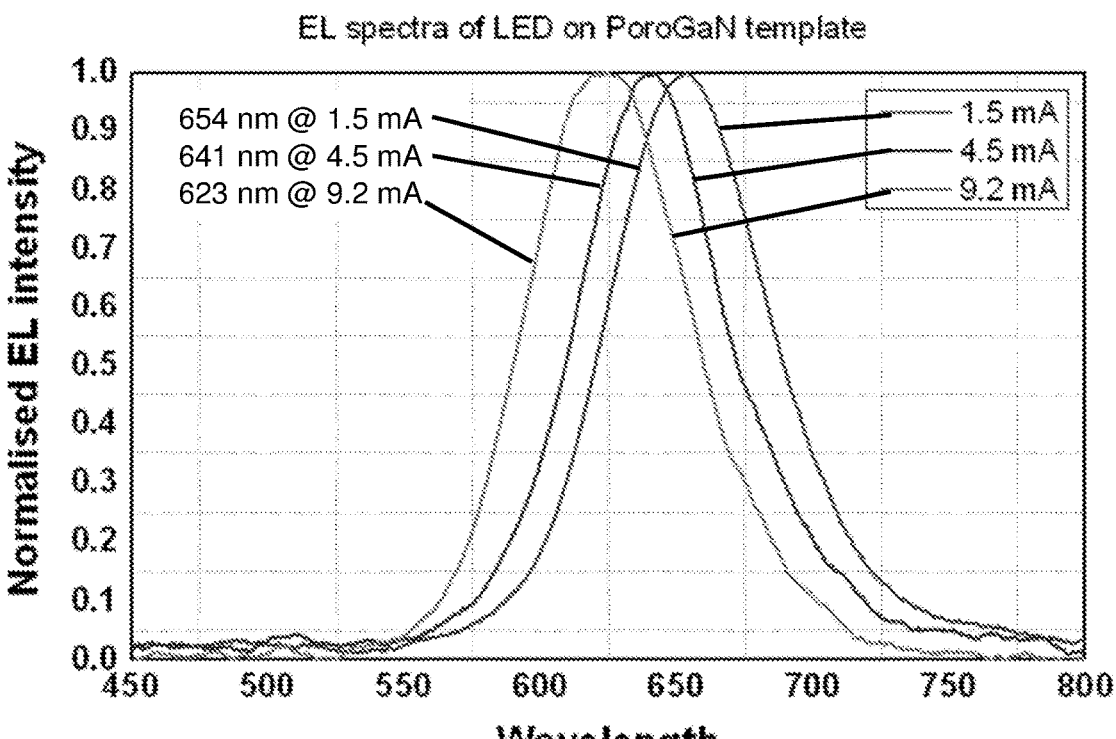
FIG. 21 is a graph of normalised electroluminescence (EL) intensity vs wavelength at different current injections, for the same InGaN LED as FIG. 15 grown over a porous region.

FIGS. 20 and 21 compare the emission characteristics of an InGaN LED on a non-porous substrate (FIG. 20) and the same InGaN LED grown on a template comprising a porous layer of III-nitride material. Comparison of these two graphs demonstrates the shift towards longer emission wavelengths caused by the porous underlayer, as the emission of the LED on the porous template is consistently between 21 nm and 45 nm longer than that of the same LED on the non-porous template.

Figure 22:
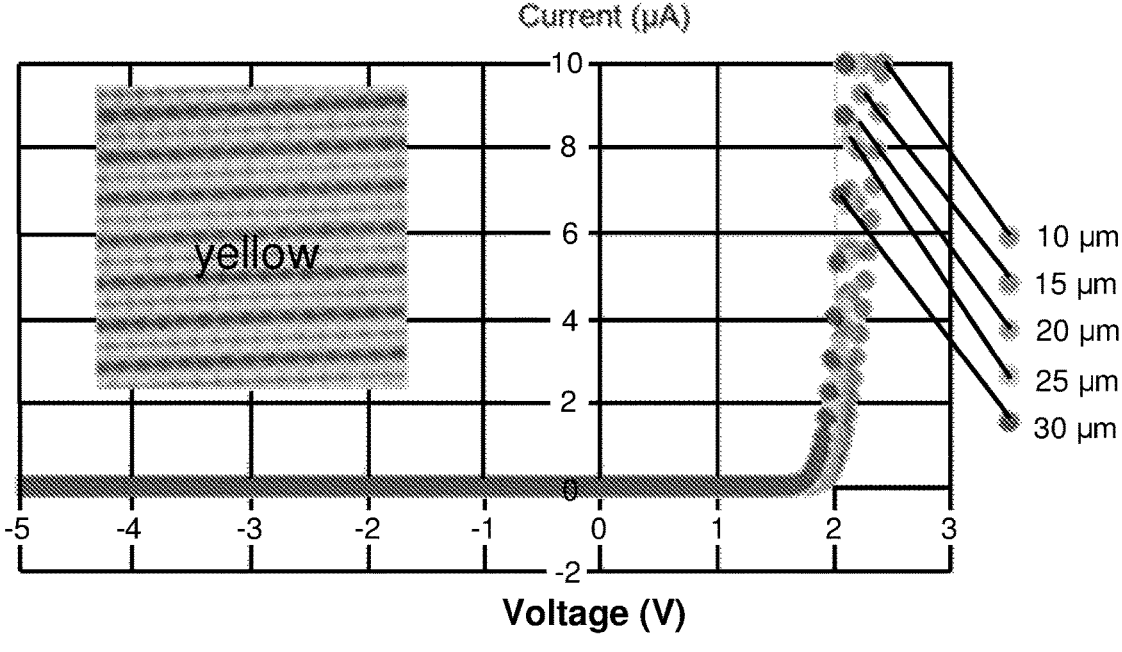
FIG. 22 is an I-V curve measured for InGaN micro-LEDs of different pixel sizes on a non-porous substrate, with the inset image showing yellow emission.
Figure 23:
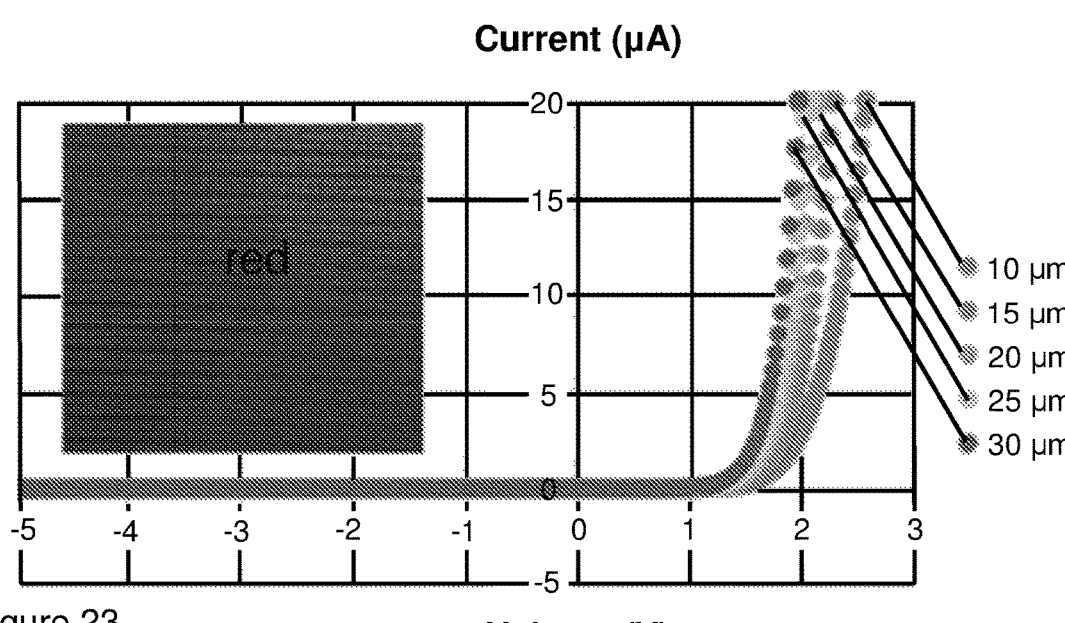
FIG. 23 is an I-V curve measured for InGaN micro-LEDs of different pixel sizes on a porous substrate, with the inset image showing red emission.

FIGS. 22 and 23 compare the I-V characteristics of yellow InGaN micro-LEDs on a non-porous substrate (FIG. 22) with red InGaN micro-LEDs on a template containing a porous layer.

FIGS. 24A-24C

Figure 24A:
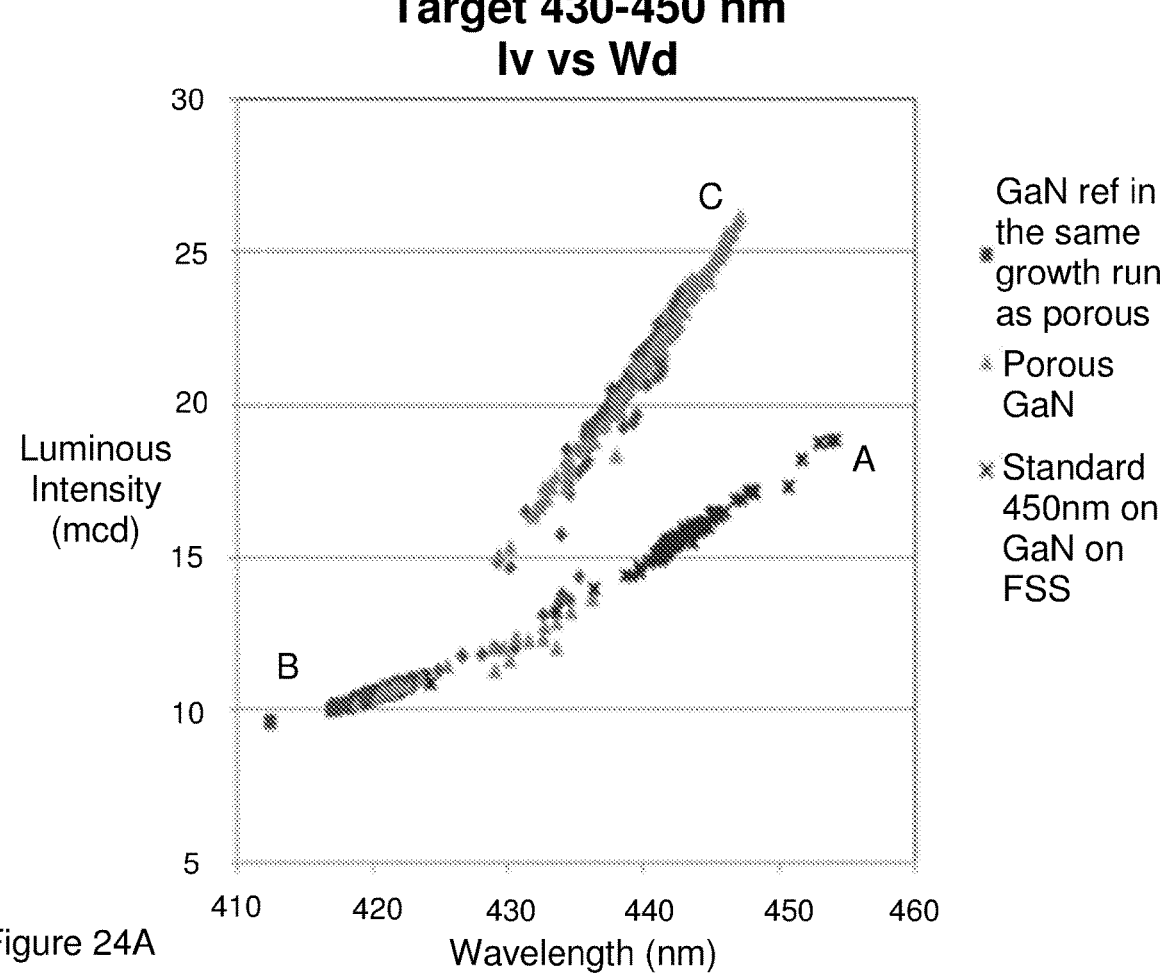
FIG. 24A is a graph of intensity vs EL wavelength comparing three types of LED grown on different templates.
Figure 24B:
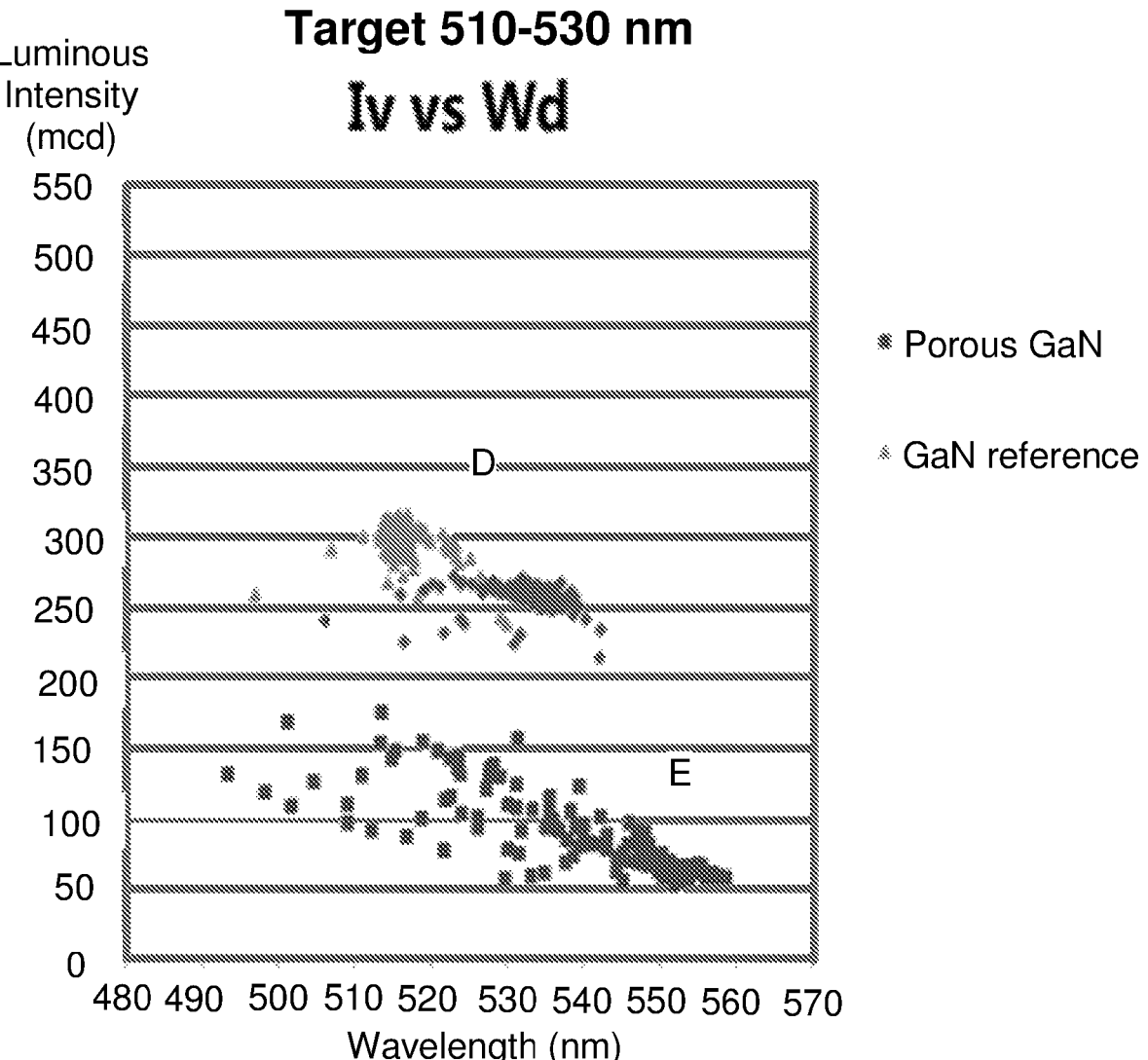
FIG. 24B is a graph of intensity vs EL wavelength comparing three types of LED grown on different templates.
Figure 24C:
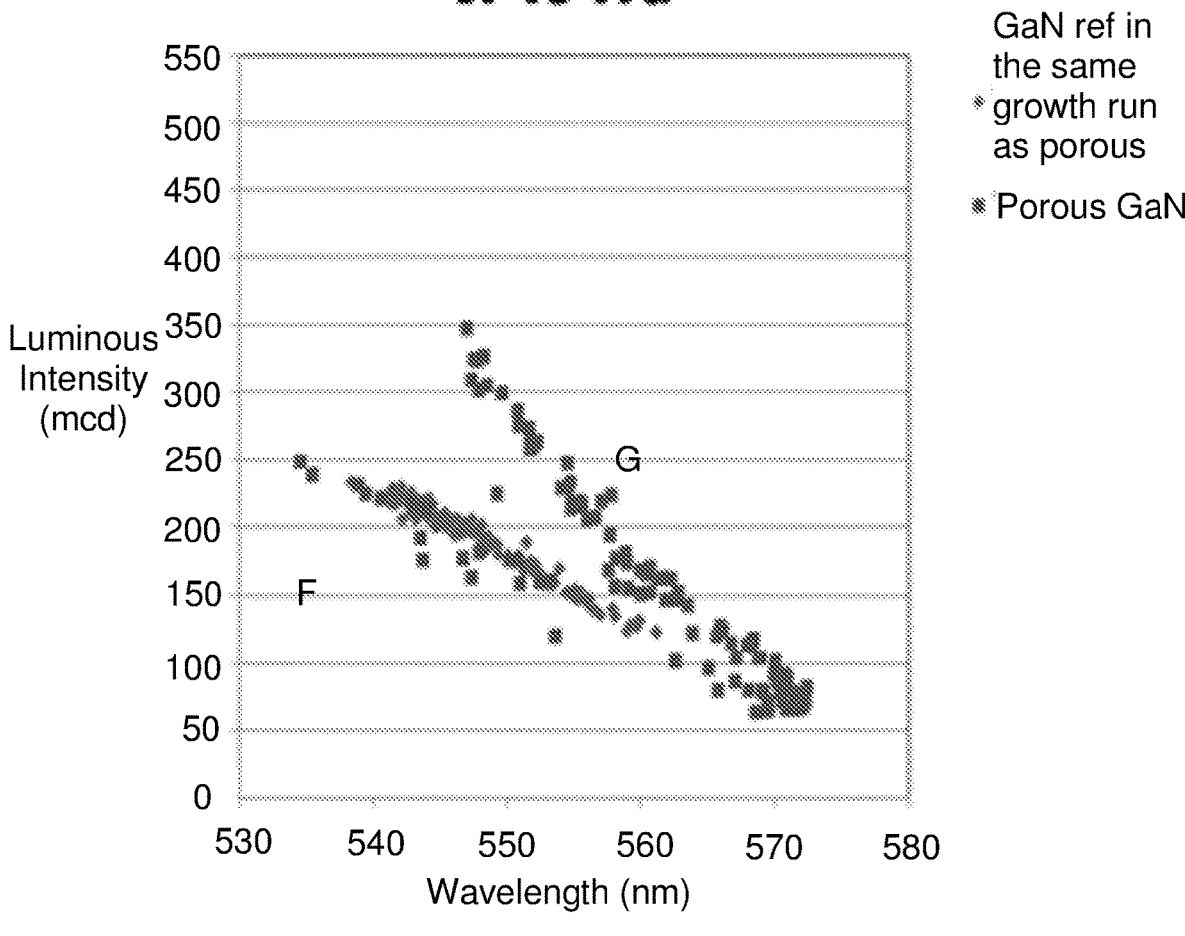
FIG. 24C is a graph of intensity vs EL wavelength comparing two types of LED grown on different templates.

The experiments of FIGS. 24A-24C were carried out on Chip on Wafer (CoW) LEDs to test the wavelength shift at blue, green and yellow wavelengths.

FIGS. 24A-C are graphs of the luminous intensity, or brightness, vs the peak EL emission wavelength emitted by an array of chip-on-wafer micro-LEDs. FIGS. 24A-C were obtained for LEDs configured to emit at a variety of EL wavelengths between 400 nm and 600 nm, showing that the red-shift effect of the present invention is obtained across a wide range of LEDs with different emission wavelengths.

In FIG. 24A, a standard 450 nm LED A grown on GaN and flat sapphire substrate (FSS) has been tested, and found to emit light mainly in the range of 440-450 nm under electrical bias. Data for LED A is shown in pink data points in FIG. 24A.

An LED structure LED B known to emit light at around 420 nm has been grown on a non-porous GaN template. As shown in FIG. 19A, LED B emits light around 425-425 nm under electrical bias. Data for LED B is shown in dark red data points in FIG. 24A.

In order to illustrate the wavelength red-shift provided by the present invention, LED C with the same LED structure as LED B has been grown on a template containing a porous GaN region. Data for LED C is shown in green data points in FIG. 24A. LED B (which emits at a peak wavelength of around 420 nm on a non porous substrate) was chosen as a suitable LED structure for the target of providing an LED C with a peak EL emission wavelength in the range of 430-450 nm, so that LED C emits in the violet region of the visible spectrum when overgrown on the porous template.

LEDs B and C have the same LED structure (the same active region and n- and p-type regions) and were grown in the same epitaxial growth run under identical growth conditions. As shown in FIG. 24A, however, the fact that LED C is formed over a porous region leads to significant differences in emission behaviour. Firstly, LED C on porous GaN emits at longer wavelengths than LED B, in the range of 430-445 nm compared to 420 nm. The overgrowth over the porous region has thus caused a wavelength red-shift averaging around 10-25 nm for the LEDs in the array. Secondly, the formation of LED C over a porous GaN template rather than a non-porous template has led to a significant increase in LED emission intensity, as a result of the improved quality of the semiconductor layers overgrown over the strain relaxed porous region.

In FIG. 24B, a standard green LED "D" was grown on a non-porous GaN template, and found to emit light mainly in the range of 510-530 nm under electrical bias. Data for LED D is shown in green data points in FIG. 24B.

The same green LED structure was overgrown over a similar GaN template containing a porous GaN layer to form LED E. Data for LED E is shown in dark red data points in FIG. 19B. LED E was found to emit light at longer wavelengths of averaging 540-560 nm, compared to the 520 nm emission wavelength of LED D, due to the red-shift resulting from the improved quality of the semiconductor layers overgrown over the strain relaxed porous region.

FIG. 24C shows comparative data for LED F, which is an LED structure known to emit light at around 540-560 nm nm under electrical bias. Data for LED F is shown in blue data points in FIG. 24C.

In order to illustrate the wavelength red-shift provided by the present invention, LED G with the same LED structure as LED F has been grown on a template containing a porous GaN region. Data for LED G is shown in dark red data points in FIG. 24C. LED F (which emits at a peak wavelength of around 540-560 nm on a non porous substrate) was chosen as a suitable LED structure for the target of providing an LED G with a peak EL emission wavelength in the range of 550-570 nm, so that LED G emits in the green region of the visible spectrum when overgrown on the porous template.

LEDs F and G have the same LED structure (the same active region and n- and p-type regions) and were grown in the same epitaxial growth run under identical growth conditions. As shown in FIG. 24C, however, the fact that LED G is formed over a porous region means that LED G on porous GaN emits at longer wavelengths than LED F, in the range of 550-570 nm compared to 540-560 nm. As the strain relaxation caused by the porous region allows LED G to incorporate more indium than LED F under the same growth conditions, LED G results in longer-wavelength emission.

The invention claimed is:

1. A light emitting diode (LED), comprising:
an n-doped portion;
a p-doped portion; and
a light emitting region located between the n-doped portion and a p-doped portion, the light emitting region comprising:
a light-emitting layer which emits light at a peak wavelength between 400 and 599 nm under electrical bias thereacross;
a III-nitride layer located on the light-emitting layer; and a III-nitride barrier layer located on the III-nitride layer,
wherein the light emitting diode comprises a porous region of III-nitride material,
and the LED further comprises a connecting layer of III-nitride material positioned between the n-doped portion and the porous region, and a non-porous intermediate layer of III-nitride material positioned between the porous region and the connecting layer,
and the LED is configured to emit light with a FWHM of 50 nm or less.

2. An LED according to claim 1, wherein the light emitting diode comprises at least one feature selected from:
(a) the light emitting region comprises at least one quantum well; or
(b) the III-nitride layer comprises an aluminium gallium nitride layer which has a composition $Al_yGa_{(1-y)}N$, where y is in a range from 0.1 to 1.0; or (c) a UV or blue emitting InGaN/GaN or InGaN/InGaN superlattice or InGaN layer is located between the n-doped portion and the light emitting region.

3. A LED according to claim 1, in which the LED is an orange LED, and the light emitting region emits light at a peak wavelength between 590 and 599 nm, or between 592 and 597 nm under electrical bias.

4. A LED according to claim 1, in which the LED is a yellow LED, and the light emitting region emits light at a peak wavelength between 570 and 589 nm, or between 580 and 585 nm under electrical bias; and/or in which the light-emitting layer has the composition $In_xGa_{1-x}N$, in which $0.25 \leq x \leq 0.35$.

5. An LED according to claim 1, in which the LED is a green LED, and the light emitting region emits light at a peak wavelength between 500 and 569 nm, or between 510 and 555 nm under electrical bias, or between 520 and 540 nm under electrical bias; and/or in which the light-emitting layer has the composition $In_xGa_{1-x}N$, in which $0.22 \leq x \leq 0.30$.

6. An LED according to claim 1, in which the LED is a blue LED, and the light emitting region emits light at a peak wavelength between 450 and 499 nm, or between 460 and 490 nm under electrical bias, or between 470 and 480 nm under electrical bias; and/or in which the light-emitting layer has the composition $In_xGa_{1-x}N$, in which $0.12 \leq x \leq 0.22$.

7. An LED according to claim 1, in which the LED is a violet LED, and the light emitting region emits light at a peak wavelength between 400 and 449 nm, or between 400 and 445, or between 410 and 440 nm under electrical bias; and/or in which the light-emitting layer has the composition $In_xGa_{1-x}N$, in which $0.05 \leq x \leq 0.17$.

8. An LED according to claim 1, in which the LED emits light with a FWHM of 40 nm or less, or 30 nm or less, or 20 nm or less.

9. An LED according to claim 1, in which the thickness of the connecting layer is at least 100 nm.

10. An LED according to claim 1, in which the n-doped portion comprises an n-doped III-nitride layer, in which the n-doped portion comprises n-GaN, or n-InGaN, or a stack of alternating layers of n-GaN/n-InGaN, or a stack of alternating layers of n-InGaN/n-InGaN containing different concentrations of indium.

11. An LED according to claim 1, in which the n-doped portion comprises a single-crystalline n-doped III-nitride portion, in which the n-doped portion comprises a single-crystalline n-doped III-nitride layer having a planar top surface; and in which the porous region and each layer between the porous region and the single-crystalline n-doped III-nitride layer are planar layers having a respective top surface and a respective bottom surface that are parallel to the planar top surface of the single-crystalline n-doped III-nitride layer.

12. An LED according to claim 1, in which the light-emitting layer comprises one or more quantum wells, in which the light-emitting layer is a light-emitting indium gallium nitride layer, and the light-emitting indium gallium nitride layer and/or the quantum wells have the composition $In_xGa_{1-x}N$, in which $0.15 \leq x < 0.35$.

13. An LED according to claim 1, in which the LED comprises a cap layer of III-nitride material between the light-emitting layer and the p-doped portion; in which the p-doped portion comprises a p-doped III-nitride layer and a p-doped aluminium gallium nitride layer positioned between the p-doped III-nitride layer and the light emitting region; and/or in which the p-doped aluminium nitride layer is an electron-blocking-layer (EBL) between the cap layer and the p-type layer, in which the electron-blocking-layer contains 5-25 at % aluminium.

14. An LED array, comprising a plurality of LEDs according to claim 1.

15. A method of manufacturing an LED with a peak emission wavelength between 400 nm and 599 nm under electrical bias, comprising the step of overgrowing, over a porous region of III-nitride material, an LED structure comprising:

an n-doped portion;

a p-doped portion; and a light emitting region comprising a light-emitting layer which emits light at a peak wavelength between 400 and 599 nm under electrical bias thereacross, with a FWHM of 50 nm or less, and comprising forming the porous region of III-nitride material by electrochemical porosification through a non-porous region of III-nitride material, such that the non-porous region of III-nitride material forms a non-porous intermediate layer, and depositing one or more connecting layers of III-nitride material on the surface of the intermediate layer of III-nitride material prior to overgrowing the n-doped region, the LED light emitting region and the p-doped region.

16. A method according to claim 15, in which the LED is an orange LED with a peak emission wavelength between 590 and 599 nm under electrical bias, or between 595 and 599 nm under electrical bias.

17. A method according to claim 15, in which the LED is a yellow LED with a peak emission wavelength between 570 and 589 nm under electrical bias, or between 575 and 585 nm under electrical bias; and/or in which the light-emitting layer has the composition $In_xGa_{1-x}N$, in which $0.25 < x \leq 0.35$.

18. A method according to claim 15, in which the LED is a green LED with a peak emission wavelength between 500 and 569 nm under electrical bias, or between 510 and 555 nm under electrical bias, or between 520 and 540 nm under electrical bias; and/or in which the light-emitting layer has the composition $In_xGa_{1-x}N$, in which $0.22 \leq x \leq 0.30$.

19. A method according to claim 15, in which the LED is a blue LED, and the light emitting region emits light at a peak emission wavelength between 450 and 499 nm under electrical bias, or between 455 and 495 nm under electrical bias, or between 460 and 480 nm under electrical bias; and/or in which the light-emitting layer has the composition $In_xGa_{1-x}N$, in which $0.18 \leq x \leq 0.25$.

20. A method according to claim 15, in which the LED is a violet LED, and the light emitting region emits light at a peak wavelength between 400 and 449 nm under electrical bias, or between 410 and 435 nm under electrical bias; and/or in which the light-emitting layer has the composition $In_xGa_{1-x}N$, in which $0.15 \leq x \leq 0.22$.

21. A method according to claim 15, in which the light emitting layer is an indium gallium nitride layer with the composition $In_xGa_{1-x}N$, in which $0.15 \leq x \leq 0.40$.

22. A method according to claim 15, comprising overgrowing the light emitting region in a temperature range of 600° C.-800° C.

* * * * *